US008847311B2

(12) United States Patent
Meiser et al.

(10) Patent No.: US 8,847,311 B2
(45) Date of Patent: Sep. 30, 2014

(54) SEMICONDUCTOR DEVICE AND METHOD OF MANUFACTURING A SEMICONDUCTOR DEVICE

(71) Applicant: Infineon Technologies AG, Neubiberg (DE)

(72) Inventors: Andreas Meiser, Sauerlach (DE); Franz Hirler, Isen (DE); Christian Kampen, Munich (DE)

(73) Assignee: Infineon Technologies AG, Neubiberg (DE)

( * ) Notice: Subject to any disclaimer, the term of this patent is extended or adjusted under 35 U.S.C. 154(b) by 0 days.

(21) Appl. No.: 13/731,380

(22) Filed: Dec. 31, 2012

(65) Prior Publication Data

US 2014/0183629 A1    Jul. 3, 2014

(51) Int. Cl.
*H01L 29/78* (2006.01)
*H01L 29/66* (2006.01)

(52) U.S. Cl.
CPC ...... *H01L 29/7816* (2013.01); *H01L 29/66681* (2013.01)
USPC .......................................... 257/337

(58) Field of Classification Search
CPC ............ H01L 29/78; H01L 29/66492
USPC ......................... 257/337, 288, 247
See application file for complete search history.

(56) References Cited

U.S. PATENT DOCUMENTS

| 7,755,104 | B2* | 7/2010 | Yagishita ................. 257/192 |
| 7,777,278 | B2 | 8/2010 | Hirler et al. |
| 7,795,088 | B2* | 9/2010 | Hsu et al. ................. 438/216 |
| 2006/0006386 | A1 | 1/2006 | Hirler et al. |
| 2012/0175749 | A1* | 7/2012 | Haensch et al. ........... 257/623 |
| 2012/0187486 | A1* | 7/2012 | Goto et al. ................ 257/347 |
| 2012/0193722 | A1* | 8/2012 | Inaba ....................... 257/368 |
| 2012/0211807 | A1* | 8/2012 | Yu et al. ................... 257/288 |
| 2012/0235214 | A1* | 9/2012 | Juengling ................. 257/288 |
| 2012/0261643 | A1* | 10/2012 | Cohen et al. ............... 257/27 |
| 2012/0292665 | A1* | 11/2012 | Marino et al. ............ 257/194 |
| 2012/0292707 | A1* | 11/2012 | Toh et al. ................. 257/365 |
| 2014/0008733 | A1* | 1/2014 | Shrivastava et al. ........ 257/401 |

* cited by examiner

*Primary Examiner* — Nathan Ha
(74) *Attorney, Agent, or Firm* — Murphy, Bilak & Homiller, PLLC

(57) ABSTRACT

A semiconductor device includes a transistor, formed in a semiconductor substrate having a first main surface. The transistor includes a channel region, doped with dopants of a first conductivity type, a source region, a drain region, the source and the drain region being doped with dopants of a second conductivity type different from the first conductivity type, a drain extension region, and a gate electrode adjacent to the channel region. The channel region is disposed in a first portion of a ridge. The drain extension region is disposed in a second portion of the ridge, and includes a core portion doped with the first conductivity type. The drain extension region further includes a cover portion doped with the second conductivity type, the cover portion being adjacent to at least one or two sidewalls of the second portion of the ridge.

19 Claims, 33 Drawing Sheets

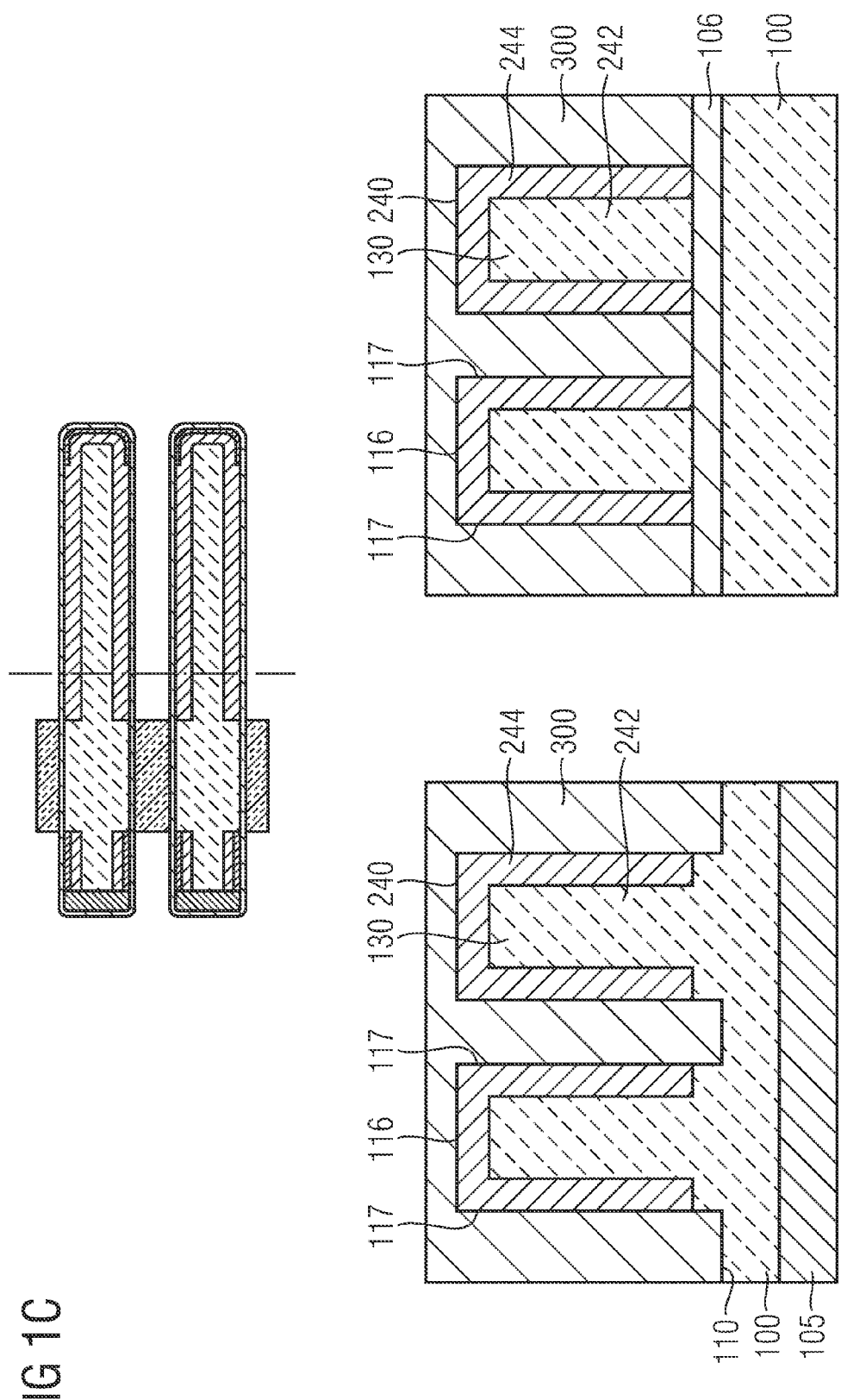

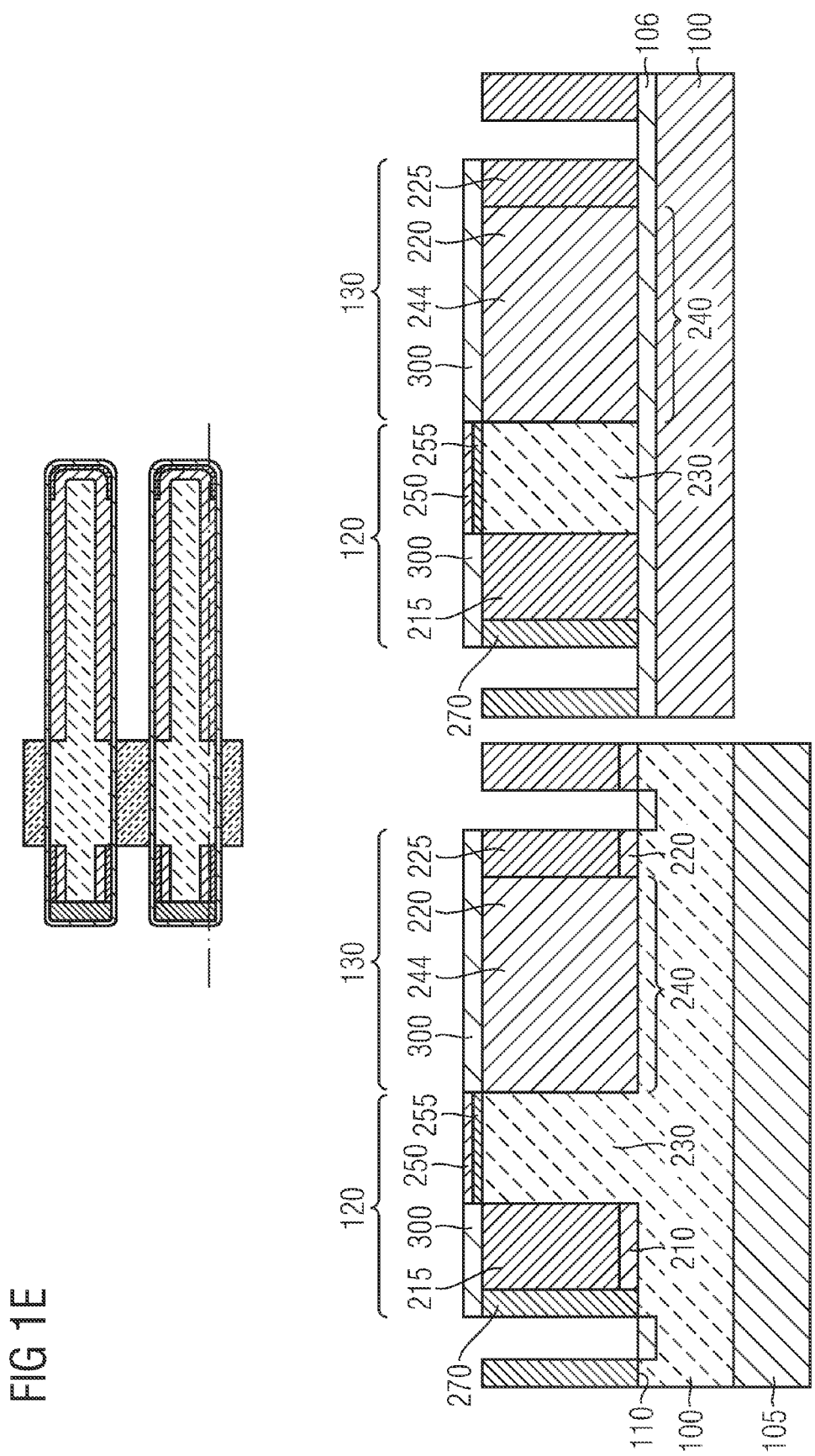

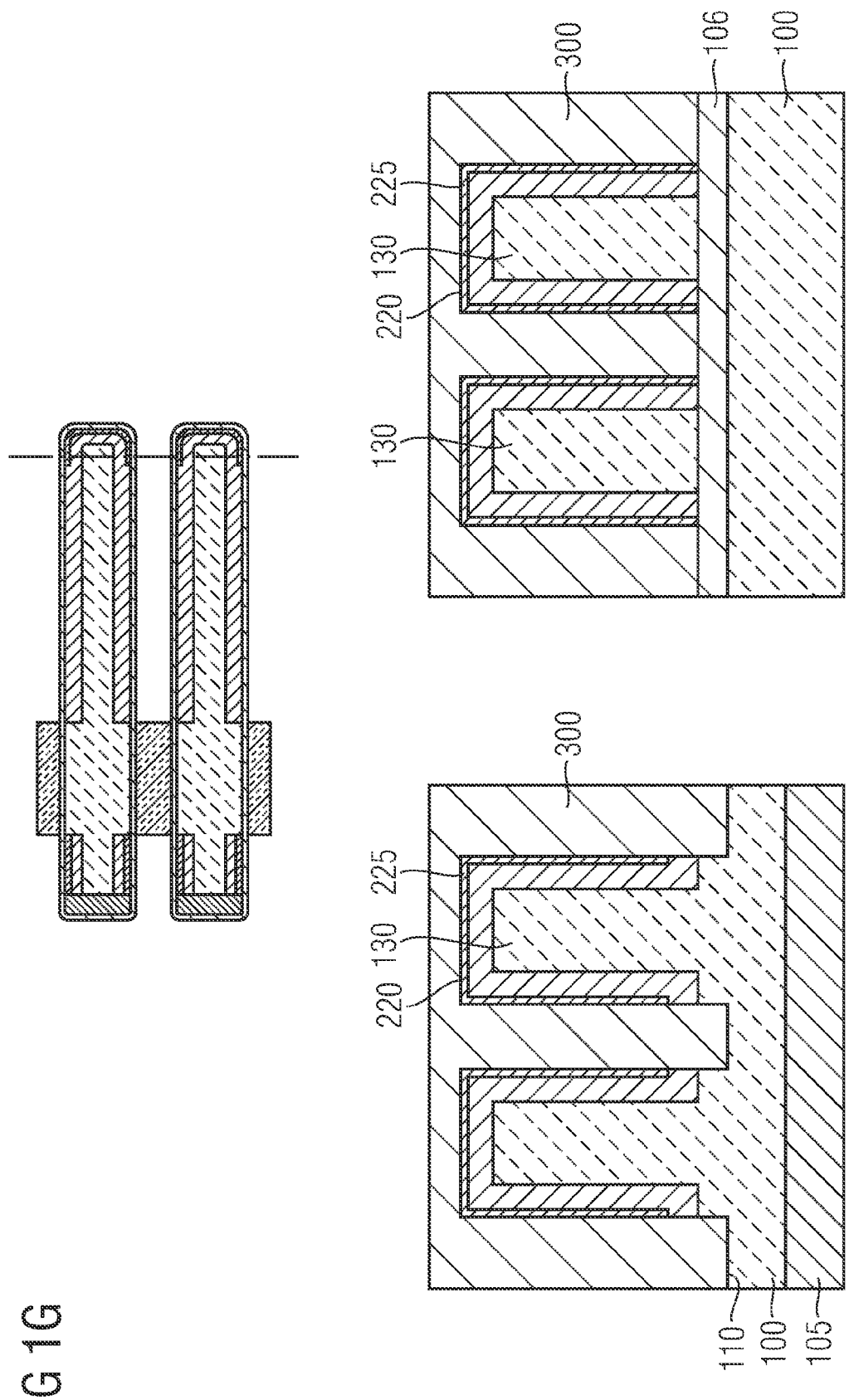

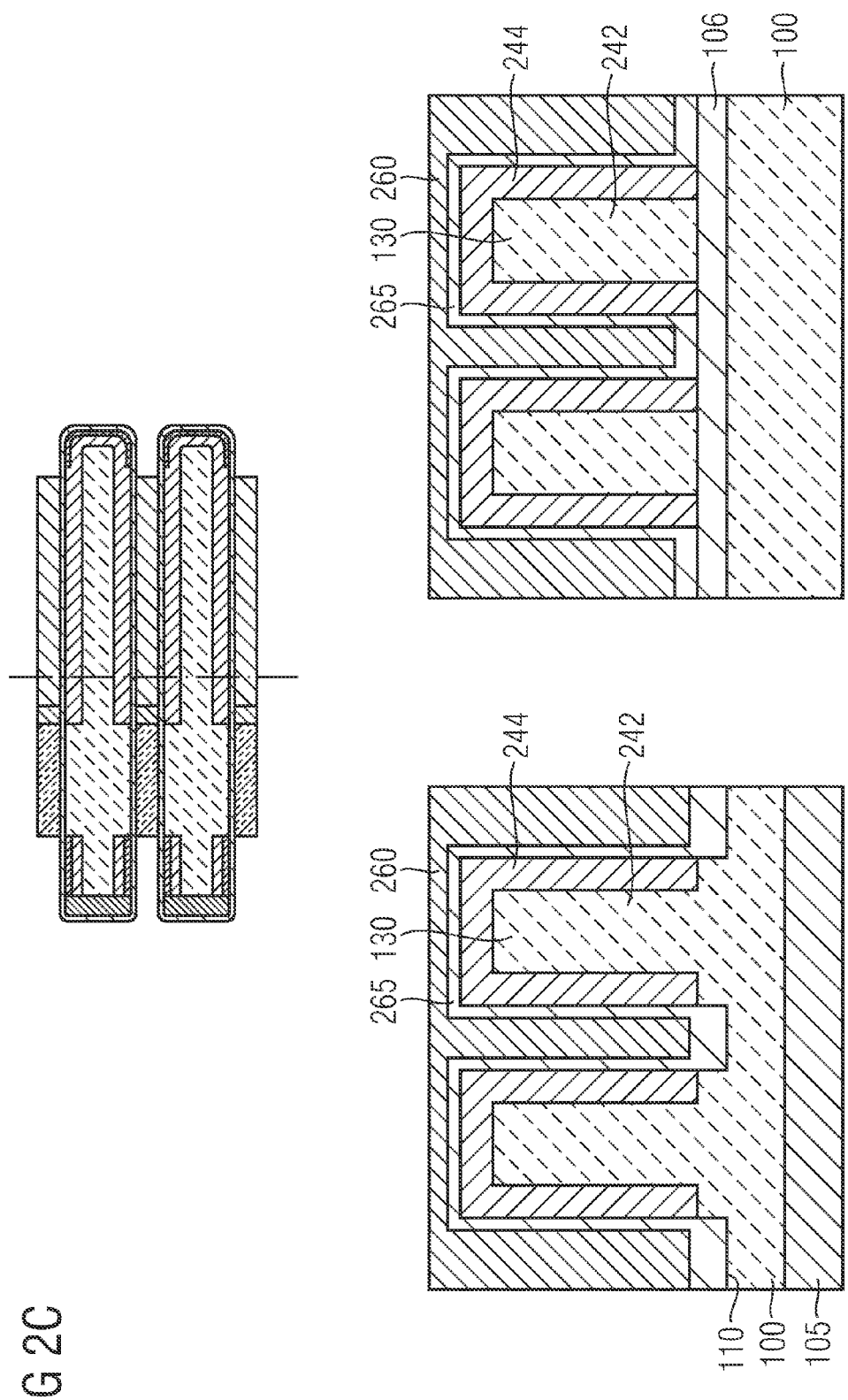

FIG 2E
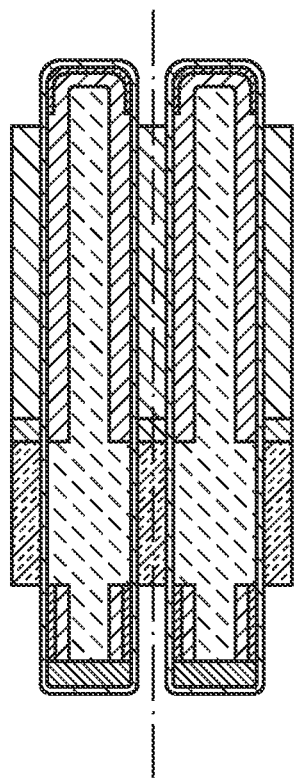
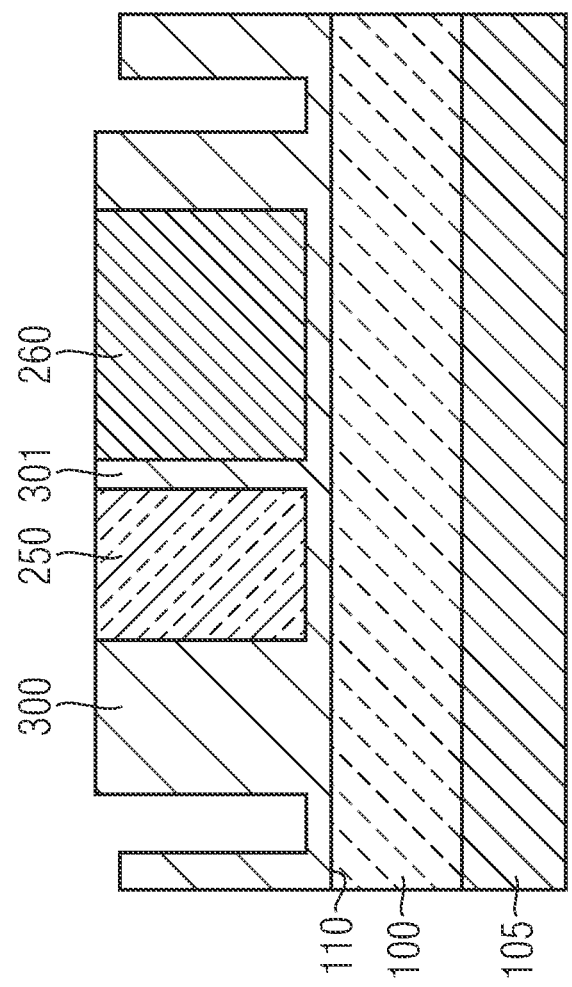

FIG 2F
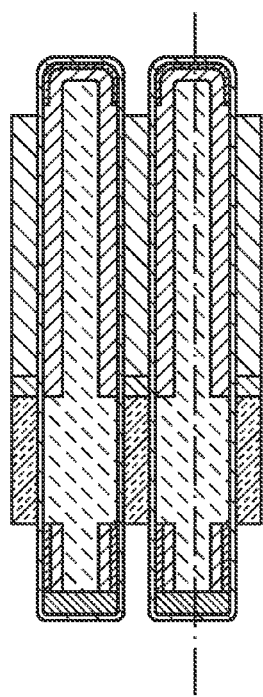
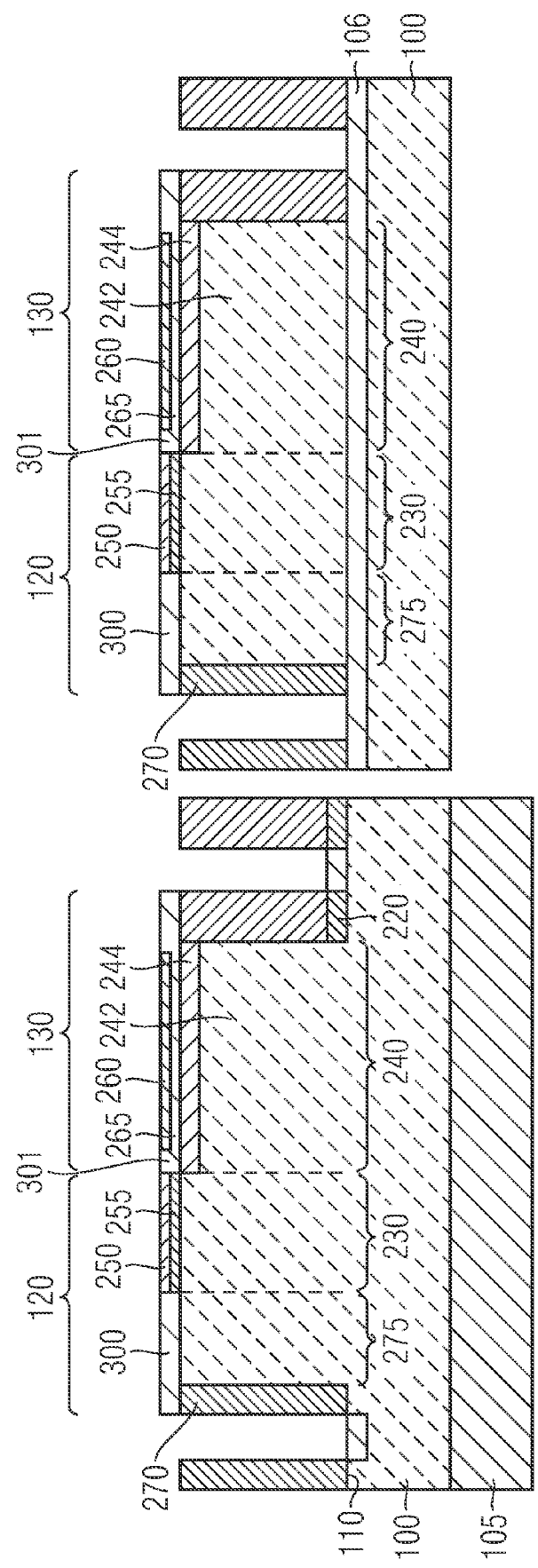

FIG 7A
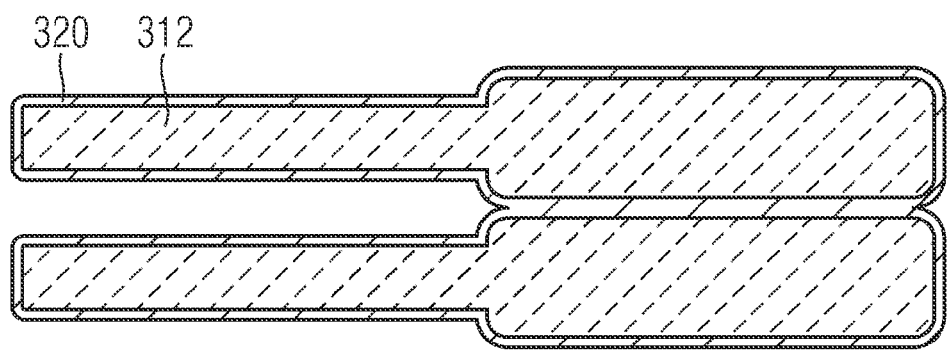
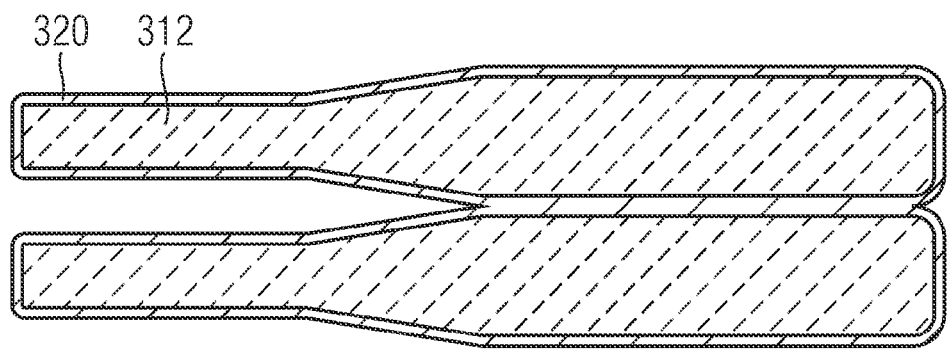

FIG 7B
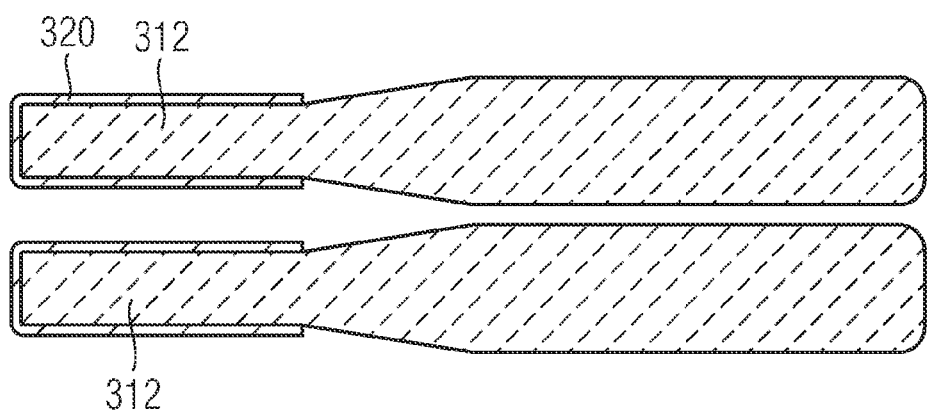

FIG 7C
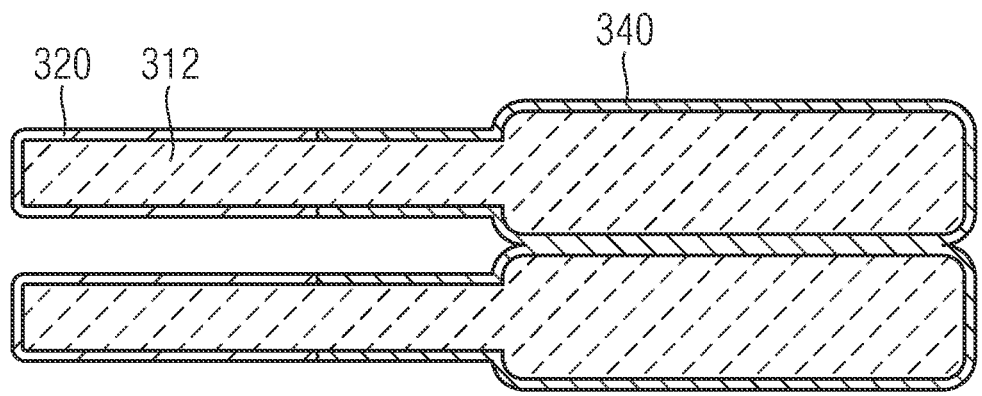
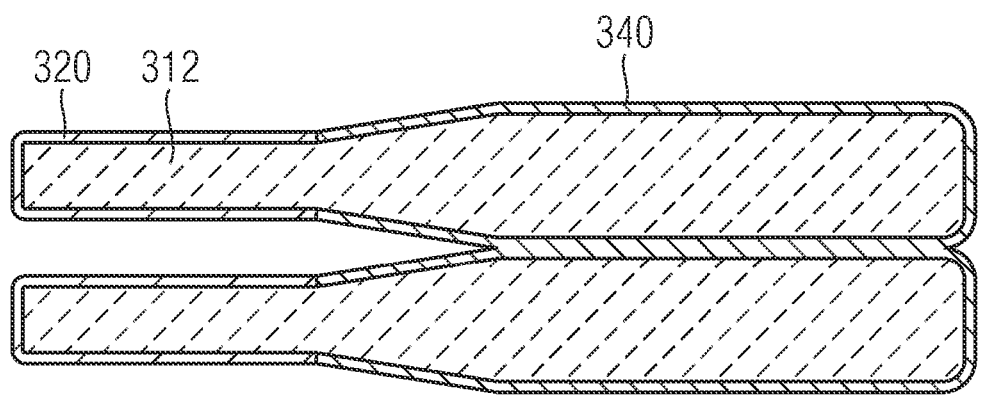

US 8,847,311 B2

SEMICONDUCTOR DEVICE AND METHOD OF MANUFACTURING A SEMICONDUCTOR DEVICE

BACKGROUND

MOS power transistors or MOS power devices, which are commonly employed in automotive and industrial electronics, should have a low switch-on resistance ($R_{on}$), when being switched on. In a switch-off state, they should have a high breakdown voltage characteristic and withstand high source-drain voltages. Further, attempts are being made to reduce the capacitances, in particular, the gate-drain capacitance between the gate electrode and the drain electrode.

SUMMARY

According to an embodiment, a semiconductor device comprises a transistor, formed in a semiconductor substrate having a first main surface. The transistor includes a channel region doped with dopants of a first conductivity type, a source region, and a drain region. The source region and the drain region are doped with dopants of a second conductivity type different from the first conductivity type. The transistor further comprises a drain extension region, and a gate electrode adjacent to the channel region. The channel region is disposed in a first portion of a ridge, and the drain extension region is disposed in a second portion of the ridge. The drain extension region comprises a core portion doped with the first conductivity type. The drain extension region further comprises a cover portion doped with the second conductivity type, the cover portion being adjacent to at least one or two sidewalls of the second portion of the ridge.

According to a further embodiment, a semiconductor device comprises a transistor formed in a ridge formed in a first main surface of a semiconductor substrate. The transistor includes a channel region of a first conductivity type in at least a part of the ridge, and a drain extension region disposed in another part of the ridge, the drain extension region comprising a core portion of the first conductivity type and a cover portion of a second conductivity type, the cover portion being disposed at least at one or two sidewalls of the ridge. The transistor further comprises a source region and a drain region of the second conductivity type, and a gate structure disposed to opposing sidewalls of the ridge. The channel region and the drain extension region are disposed along a first direction between the source region and the drain region, the first direction being parallel to the first main surface.

According to a further embodiment, a semiconductor device comprises a transistor, formed in a semiconductor substrate having a first main surface. The transistor includes a channel region doped with dopants of a first conductivity type, a source region, and a drain region. The source region and the drain region are doped with dopants of a second conductivity type different from the first conductivity type. The transistor further comprises a gate electrode adjacent to the channel region, the channel region being disposed in a first portion of a ridge. The source region is disposed in a further portion of the ridge, adjacent to the channel region, wherein the source region is disposed adjacent to at least one of a top side and two sidewalls of the further portion of the ridge, and a core portion of the further portion of the ridge is doped with dopants of the first conductivity type and forms a body contact path.

According to an embodiment, a method of manufacturing a semiconductor device comprises forming a transistor in a semiconductor substrate, the semiconductor substrate having a first main surface. Forming the transistor comprises forming a ridge including a first ridge portion and a second ridge portion in the semiconductor substrate, the ridge extending along the first direction. The method further comprises forming a source region, a drain region, a channel region, a drain extension region and a gate electrode adjacent to the channel region in the ridge. The method further comprises doping the channel region with dopants of a first conductivity type, and doping the source and the drain region with dopants of a second conductivity type. Forming the drain extension region comprises forming a core portion doped with the first conductivity type in the second ridge portion. Forming the drain extension region further comprises forming a cover portion doped with the second conductivity type, the cover layer being formed so as to be adjacent to at least one or two sidewalls of the second ridge portion.

According to an embodiment, a semiconductor device comprises a transistor, formed in a semiconductor substrate having a first main surface. The transistor includes a channel region, doped with dopants of a first conductivity type, a source region, and a drain region. The source region and the drain region are doped with dopants of a second conductivity type different from the first conductivity type. The transistor further comprises a drain extension region, a gate electrode adjacent to the channel region and a field plate adjacent to the drain extension region. The channel region is disposed in a first portion of a ridge and the drain extension region is disposed in a second portion of the ridge.

Those skilled in the art will recognize additional features and advantages upon reading the following detailed description and on viewing the accompanying drawings.

BRIEF DESCRIPTION OF THE DRAWINGS

The accompanying drawings are included to provide a further understanding of the invention and are incorporated in and constitute a part of this specification. The drawings illustrate the embodiments of the present invention and together with the description serve to explain principles of the invention. Other embodiments of the invention and intended advantages will be readily appreciated as they become better understood by reference to the following detailed description.

FIG. 1C to 1G show further cross-sectional views of a semiconductor device according to an embodiment;

FIGS. 2C to 2F show further cross-sectional views of a semiconductor device according to an embodiment;

FIGS. 7A to 7C illustrate parts of a further method of manufacturing a semiconductor device;

DETAILED DESCRIPTION

Figure 1A:
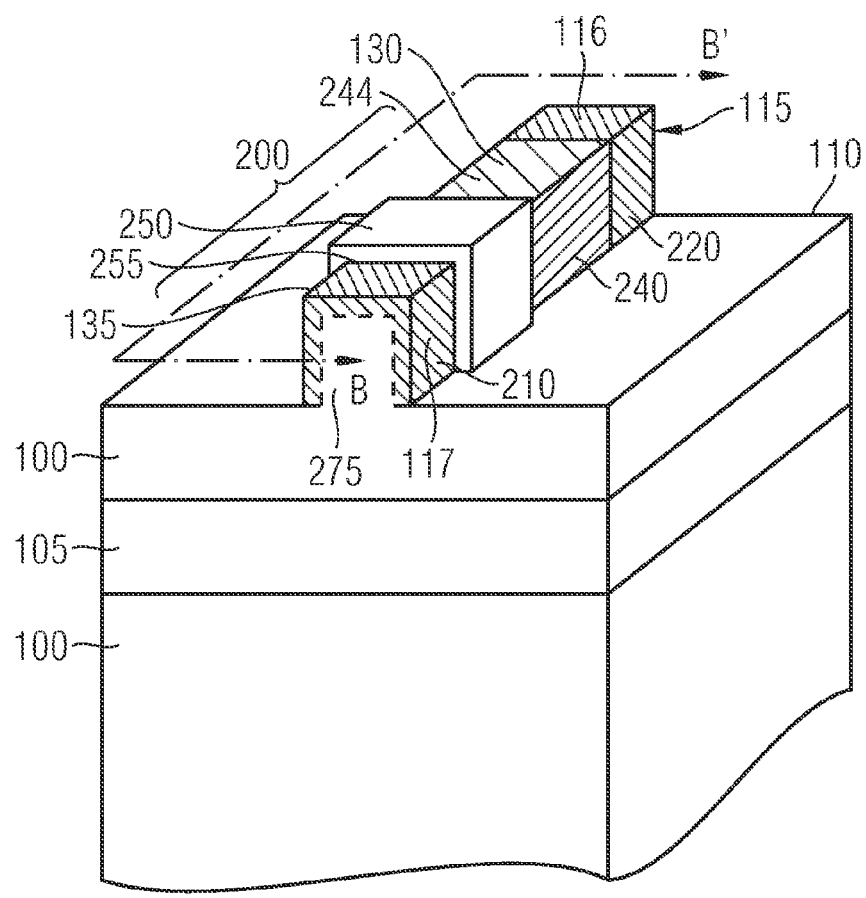
FIG. 1A shows a perspective view a of elements of a semiconductor device according to an embodiment.

In the following detailed description, reference is made to the accompanying drawings, which form a part hereof, and in which are shown by way of illustrations specific embodiments in which the invention may be practiced. It is to be understood that other embodiments may be utilized and structural or logical changes may be made without departing from the scope of the present invention. For example, features illustrated or described for one embodiment can be used on or in conjunction with other embodiments to yield yet a further embodiment. It is intended that the present invention includes such modifications and variations. The examples are described using specific language which should not be construed as limiting the scope of the appending claims. The drawings are not scaled and are for illustrative purposes only. For clarity, the same elements have been designated by corresponding references in the different drawings if not stated otherwise.

The terms "having", "containing", "including", "comprising" and the like are open and the terms indicate the presence of stated structures, elements or features but not preclude additional elements or features. The articles "a", "an" and "the" are intended to include the plural as well as the singular, unless the context clearly indicates otherwise.

The term "electrically connected" describes a permanent low-ohmic connection between electrically connected elements, for example a direct contact between the concerned elements or a low-ohmic connection via a metal and/or highly doped semiconductor. The term "electrically coupled" includes that one or more intervening element(s) adapted for signal transmission may be provided between the electrically coupled elements, for example resistors, resistive elements or elements that are controllable to temporarily provide a low-ohmic connection in a first state and a high-ohmic electric decoupling in a second state.

The Figures illustrate relative doping concentrations by indicating "−" or "+" next to the doping type "n" or "p". For example, "n−" means a doping concentration, which is lower than the doping concentration of an "n"-doping region while an "n+"-doping region has a higher doping concentration than an "n"-doping region. Doping regions of the same relative doping concentration do not necessarily have the same absolute doping concentration. For example, two different "n"-doping regions may have the same or different absolute doping concentrations. In the Figures and the description, for the sake of a better comprehension, often the doped portions are designated as being "p" or "n"-doped. As is clearly to be understood, this designation is by no means intended to be limiting. The doping type can be arbitrary as long as the described functionality is achieved. Further, in all embodiments, the doping types can be reversed.

The terms "wafer", "substrate" or "semiconductor substrate" used in the following description may include any semiconductor-based structure that has a semiconductor surface. Wafer and structure are to be understood to include silicon, silicon-on-insulator (SOI), silicon-on sapphire (SOS), doped and undoped semiconductors, epitaxial layers of silicon supported by a base semiconductor foundation, and other semiconductor structures. The semiconductor need not be silicon-based. The semiconductor could as well be silicon-germanium, germanium, or gallium arsenide. According to embodiments of the present application, generally, silicon carbide (SiC) or gallium nitride (GaN) is a further example of the semiconductor substrate material.

Generally, for patterning material layers, a photolithographic method may be used in which a suitable photoresist material is provided. The photoresist material is photolithographically patterned using a suitable photomask. The patterned photoresist layer can be used as a mask during subsequent processing steps. For example, as is common, a hardmask layer or a layer made of a suitable material such as silicon nitride, polysilicon or carbon may be provided over the material layer to be patterned. The hardmask layer is photolithographically patterned using an etching process, for example. Taking the patterned hardmask layer as an etching mask, the material layer is patterned.

The terms "lateral" and "horizontal" as used in this specification intend to describe an orientation parallel to a first surface of a semiconductor substrate or semiconductor body. This can be for instance the surface of a wafer or a die.

The term "vertical" as used in this specification intends to describe an orientation which is arranged perpendicular to the first surface of the semiconductor substrate or semiconductor body.

FIG. 1A shows a perspective view of a semiconductor device according to an embodiment. The semiconductor device illustrated in FIG. 1A comprises a transistor 200 that is formed in a semiconductor substrate 100 having a first main surface 110. According to an embodiment, a buried well portion may be disposed in the semiconductor substrate 100. For example, the semiconductor substrate is doped with a first conductivity type and the doped well portion 105 is doped with a second conductivity type. For example, the first conductivity type may be p-doped and the second conductivity type is n-doped or vice versa.

The transistor shown in FIG. 1A comprises a source region 210, a drain region 220, a channel region 230 and a drain extension region 240, and a gate electrode 250. The gate electrode 250 is adjacent to the channel region 230, the gate electrode 250 being insulated from the channel region 230 by means of a gate dielectric layer 255. The gate electrode 250 is configured to control a conductivity of a channel formed in the channel region 230. The channel region 230 and the drain extension region 240 are disposed along a first direction between the source region 210 and the drain region 220. The first direction is parallel to the first main surface 110.

As is further illustrated in FIG. 1A, the components of the transistor are disposed in a ridge 115 that is formed in the first main surface 110 of the semiconductor substrate 100 and that extends along the first direction. Accordingly, the channel region 230 is disposed in a first portion 120 of the ridge 115 and the drain extension region is disposed in a second portion 130 of the ridge 115. The drain extension region 240 comprises a core portion (not shown in this Figure) that is doped with the first conductivity type. The drain extension region further comprises a cover portion 244 that is doped with the second conductivity type. The cover portion 244 is disposed to be adjacent to at least one or two sidewalls 117 of the second portion 130 of the ridge 115. The sidewalls extend in a direction that intersects the first main surface 110 of the semiconductor substrate 100. According to an embodiment, the top side may be approximately parallel to the first main surface 110. For example, the cover portion 244 may be adjacent to two sidewalls 117 and a top side 116 of the second portion 130 of the ridge 115. According to a further embodiment, the cover portion 244 may be adjacent to only one or two sidewalls of the second portion 130 of the ridge 115. For example, a further layer, different from the cover portion 244 may be disposed on the top side 116 of the ridge 115.

The channel region 230 is doped with the first conductivity type. The source region and the drain region are doped with a second conductivity type which is different from the first conductivity type.

In the embodiment illustrated in FIG. 1A, the source region 210 and the drain region 220 are implemented by doped portions of the second conductivity type. For example, the source region 210 is disposed in a third portion 135 of the ridge 115. A core portion of the third portion 135 of the ridge 115 has the first conductivity type and a region adjacent to a top surface 116 and the two sidewalls 117 of the third portion 135 of the ridge 115 is doped with the second conductivity type. As will be explained in the following, a core portion of the ridge 115 having the first conductivity type and being disposed adjacent to the source region 210 of the transistor 200, may implement a body contact path 275 that prevents a parasitic bipolar transistor from being formed. According to an embodiment, the body contact path 275 may be doped with a higher dopant concentration than the channel region 230. Further, the pn-junction formed at the interface between the body contact path 275 and the source region 210 implements a body diode that may be used for inductive switching processes. According to a further embodiment, the bulk contact may be accomplished by a doped well region of the second conductivity type. The doped well region may be disposed beneath the channel region and, optionally, beneath a portion of the drain extension region 240. In this case and according to further embodiments, also the core portion of the ridge 115 may be doped with the second conductivity type.

Figure 1B:
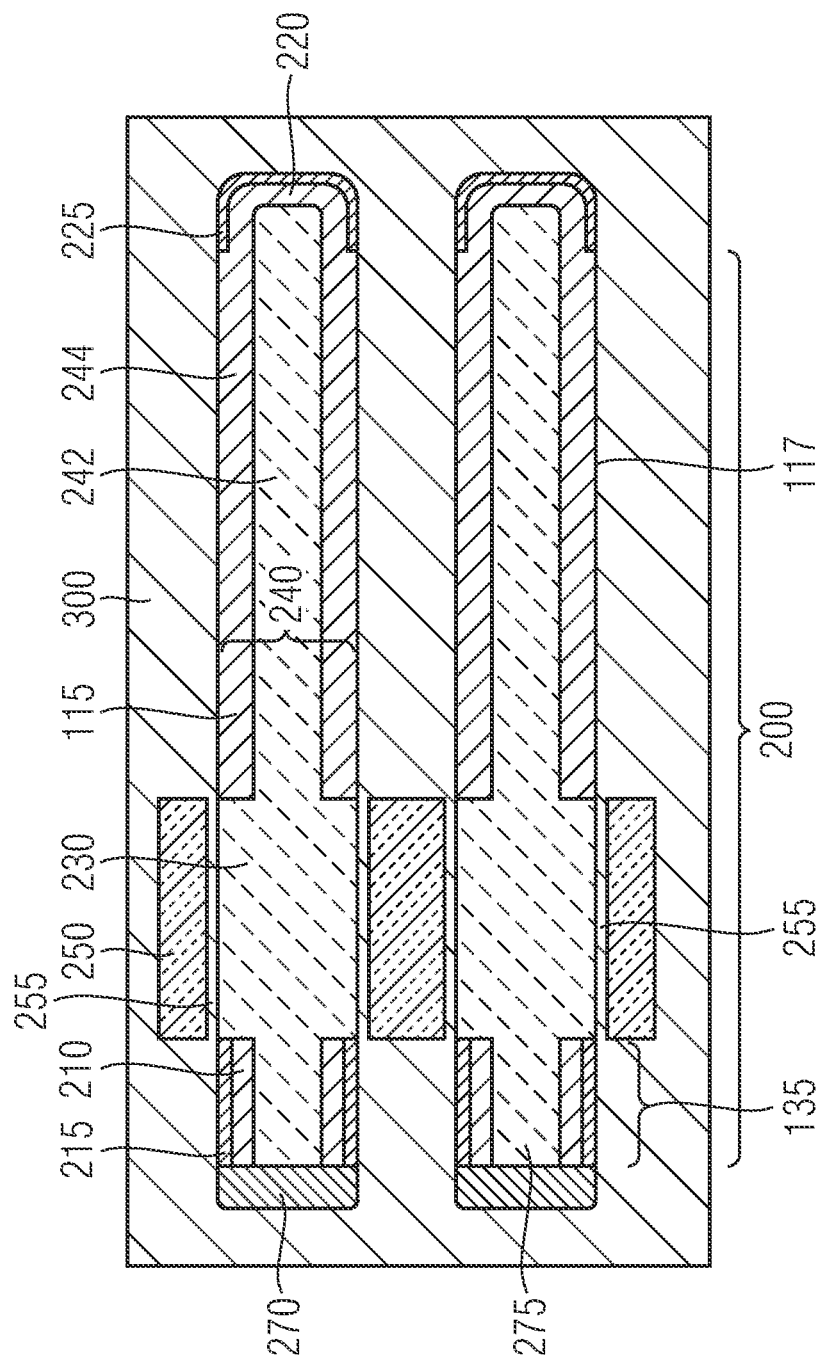
FIG. 1B shows a cross-sectional view of a semiconductor device in a plane parallel to a first main surface of the substrate.

FIG. 1B shows a cross-sectional view of the structure shown in FIG. 1A, the cross-sectional view being taken along a plane that is parallel to the first main surface 110. As is shown, the transistor 200 comprises a source region including a source contact doping 215, the source region being disposed adjacent to a sidewall of a ridge 115. The semiconductor device further comprises a drain region 220 including a drain contact doping 225 disposed at another end side of the ridge. A channel region 230 is disposed adjacent to the source region 210 and extends along the width of the ridge 115, the gate electrode 250 being adjacent to the channel region 230, the gate electrode 250 being insulated from the channel region 230 by means of a gate dielectric. Moreover, the drain extension region 240 is disposed between the channel region 230 and the drain region 220. The drain extension region 240 comprises a core portion 242 which is doped with the first conductivity type. Further, the drain extension region comprises a cover portion 244 which is disposed at the sidewalls 117 of the drain extension region 240.

The cross-sectional views of FIG. 1C are taken at a portion of the drain extension region and in a direction that intersects the first direction. The left-hand portion of FIG. 1C illustrates a cross-sectional view in case of using a p- or n-doped substrate comprising a doped well portion 105, and the right-hand portion of FIG. 1C illustrates a cross-sectional view of the substrate when using an SOI substrate, in which a buried oxide layer 106 is disposed within the semiconductor substrate 100. The upper portion of FIG. 1C shows a schematic plan view illustrating a direction of the cross-sectional view. As is specifically illustrated in FIG. 1C, the cover portion 244 is disposed so as to be adjacent to a top side 116 and to the sidewalls 117 of the second portion 130 of the ridge. The core portion 242 is doped with the first conductivity type. The drain extension region is disposed in a second portion 130 of the ridge. An insulating layer 300 such as silicon oxide may be disposed so as to fill the space between adjacent second ridge portions 130.

Figure 1D:
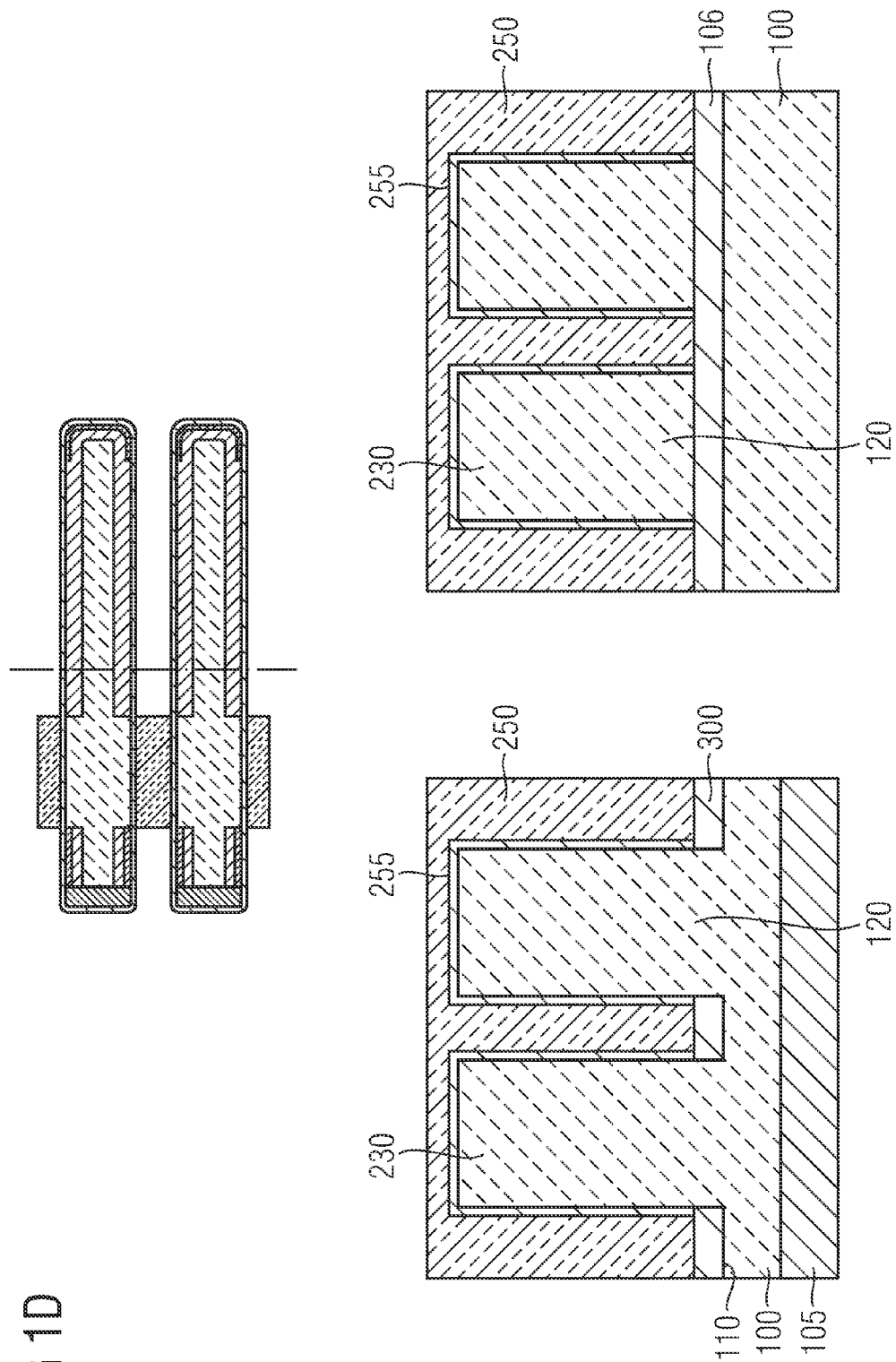

FIG. 1D shows a cross-sectional view of a channel region 230 of the transistor, being taken along a direction intersecting the first direction. The left-hand portion of FIG. 1D illustrates a cross-sectional view of a p- or n-doped substrate 100, including a buried well implantation layer 105, and the right-hand portion of FIG. 1D illustrates a cross-sectional view when an SOI substrate is used, the SOI substrate comprising a buried oxide layer 106. The upper portion of FIG. 1D illustrates a location at which the cross-sectional views are taken.

As is shown in FIG. 1D, the channel region 230 is disposed in a first portion 120 of the ridge. The gate electrode 250 is disposed adjacent to the first ridge portion 120. A gate dielectric 255 is disposed between the gate electrode 250 and the channel region 230. The gate electrode 250 may be disposed so as to completely fill the spaces between adjacent ridges at the first ridge portion 120.

The transistor illustrated in FIGS. 1A to 1D implements a so-called FinFET, in which the channel region 230 is formed in the semiconductor substrate portion having the shape of a fin or a ridge. Due to the structure, a three-dimensional shape of the semiconductor device may be implemented. The width of the channel or, differently stated, the portion of the channel region that is adjacent to the gate electrode 250 corresponds to the width of the ridge, measured perpendicularly to the first direction or extension direction of the ridge, and the height of the first ridge portion 120. Accordingly, it is possible to increase the effective area of the transistor without increasing the area needed for manufacturing the transistor.

In case of being switched on, a conductive inversion layer is formed at the boundary between the channel region 230 and the gate dielectric 255. Accordingly, the transistor is in a conducting state from the source region 210 to the drain region 220 via the drain extension region or drift zone 240. In case of switching-off, in the drain extension region 240, carriers of the core portion 242 of the first conductivity type and carriers within the cover portion 244 of the second conductivity type compensate each other. As a consequence, the cover portion 244 may be depleted, resulting in a blocking of the current flow at a high breakdown voltage.

Due to the special construction of the drain extension region 240 comprising a core portion of the first conductivity type and a cover portion 244 that is disposed adjacent to two sidewalls 117 and the top side 116 of the second ridge 130, charge carriers may be compensated (depleted) in case of a reverse voltage being applied. As a consequence, it is possible to increase a doping concentration of the cover portion 244 in comparison to a case in which the drain extension region is implemented by semiconductor material of the second conductivity type only, whereby the resistivity of the drain extension region may be decreased.

As is particularly shown in FIG. 1B, a core portion 275 of the ridge in a third ridge portion 135 implements a body contact path enabling a contact of the channel region 230 or body region to the bulk contact 270 or body contact. Thereby, a parasitic bipolar transistor is avoided which could otherwise be formed at this portion. Moreover, in an off-state of the transistor, the drain-extension region 240 may be depleted more easily. In the embodiment shown in FIGS. 1A to 1D, the gate electrode 250 is disposed so as to be adjacent to a top side 116 and two lateral sides 117 of the channel region 230. Moreover, the cover layer 244 is disposed at a top side 116 and two sidewalls 117 of the core portion 242 of the drain extension region. According to an embodiment, it is possible to increase the channel width by increasing the height of the ridge. Thereby, also the width of the drain extension region is increased. Increasing the width of the drain extension region can be accomplished while not substantially influencing the electrostatic properties in the channel region and the drain extension region and without further increasing the area demanded for implementing the device.

FIG. 1E shows a cross-sectional view of the embodiment, the cross-sectional view being taken along the first direction perpendicularly with respect to the first main surface in a region of the cover portion 244. The left-hand portion of FIG. 1E illustrates a cross-sectional view of a p- or n-doped substrate comprising a buried well implantation portion 105. Further, the right-hand portion shows a cross-sectional view of a transistor formed in an SOI substrate included in a buried oxide layer 106. The upper portion of FIG. 1E illustrates a position at which the cross-sectional views are taken. As is shown, in this area, the source region 210, the channel region 230, the drain extension region 240, in particular, the cover portion, and the drain region 220 are arranged along the first direction. A bulk contact 270 is disposed adjacent to the source contact doping 215. The bulk contact 270 is doped with a higher dopant concentration than the body contact path 275 and with a higher dopant concentration than the channel region 230. The gate electrode 250 is disposed at a top side of the channel region 230.

Figure 1F:
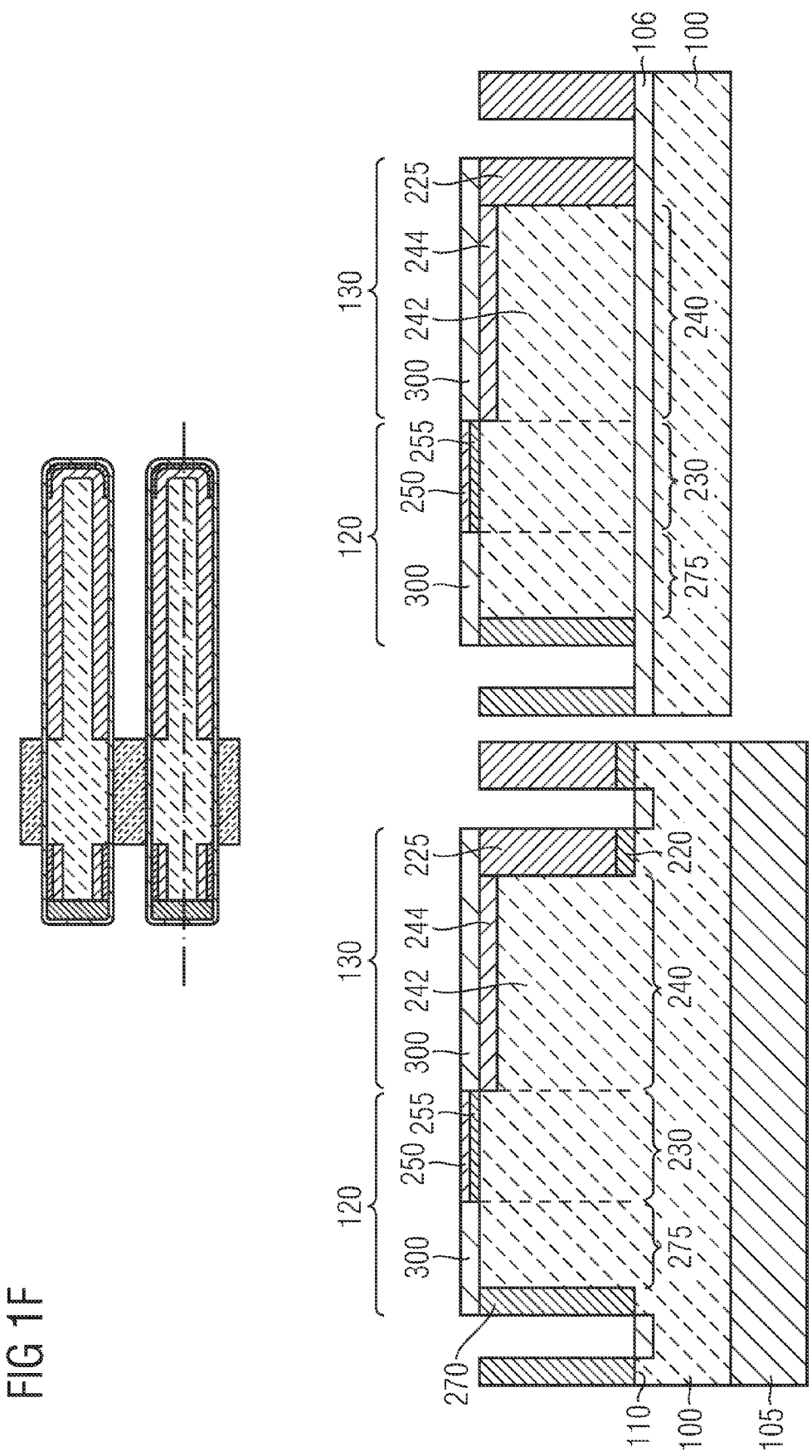

FIG. 1F shows a further cross-sectional view of the structure which is taken along the first direction so as to intersect the core portion 242 of the drain extension region 240 and the body contact path 275. As is shown, due to the body contact path, the channel region 230 or body region is connected with the bulk contact 270.

FIG. 1G shows a cross-sectional view of the transistor at a position of the drain region 220. As is shown, a drain contact doping 225 is disposed adjacent to the drain region 220. The left-hand portion of FIG. 1G shows a cross-sectional view of a transistor formed in a p- or n-doped substrate including a buried well implantation portion 105, and the right-hand portion of FIG. 1G shows a cross-sectional view of the transistor formed in an SOI substrate including a buried oxide layer 106. The upper portion of FIG. 1G illustrates a position at which the cross-sectional view is taken.

As has been explained with reference to FIGS. 1A to 1G, according to a further embodiment, a semiconductor device comprises a transistor 200, being formed in a semiconductor substrate 100 comprising a first main surface 110. The transistor 200 comprises a channel region 230, doped with dopants of a first conductivity type, a gate electrode 250 adjacent to the channel region 230, a source region 210, and a drain region 220, the source region 210 and the drain region 220 being doped with a second conductivity type, different from the first conductivity type. The channel region 230 is disposed in a first portion 120 of a ridge 115, the source region 210 being disposed in a further portion 135 of the ridge 115, adjacent to the channel region 230. The source region 210 is disposed adjacent to at least one of a top side 116 and two sidewalls 117 of the further portion 135 of the ridge 115, and a core portion of the further portion 135 of the ridge is doped with dopants of the first conductivity type and forms a body contact path 275. For example, the source region 210 may be disposed adjacent to one or two sidewalls 117 of the ridge 115. According to an embodiment, the source region may be disposed adjacent to a top side 116 of the ridge 115. According to a further embodiment, the source region may be disposed adjacent to a top side 116 and two sidewalls 117 of the ridge 115. According to an embodiment, the semiconductor may further comprise a drain extension region 240 that disposed between the channel region 230 and the drain region 220. As will be readily appreciated, this embodiment may be combined with any element described in this disclosure.

FIGS. 2A to 2G illustrate a further embodiment. In FIGS. 2A to 2G the same components as those described with respect to FIGS. 1A to 1G are shown, and only the differences are referred to.

Figure 2A:
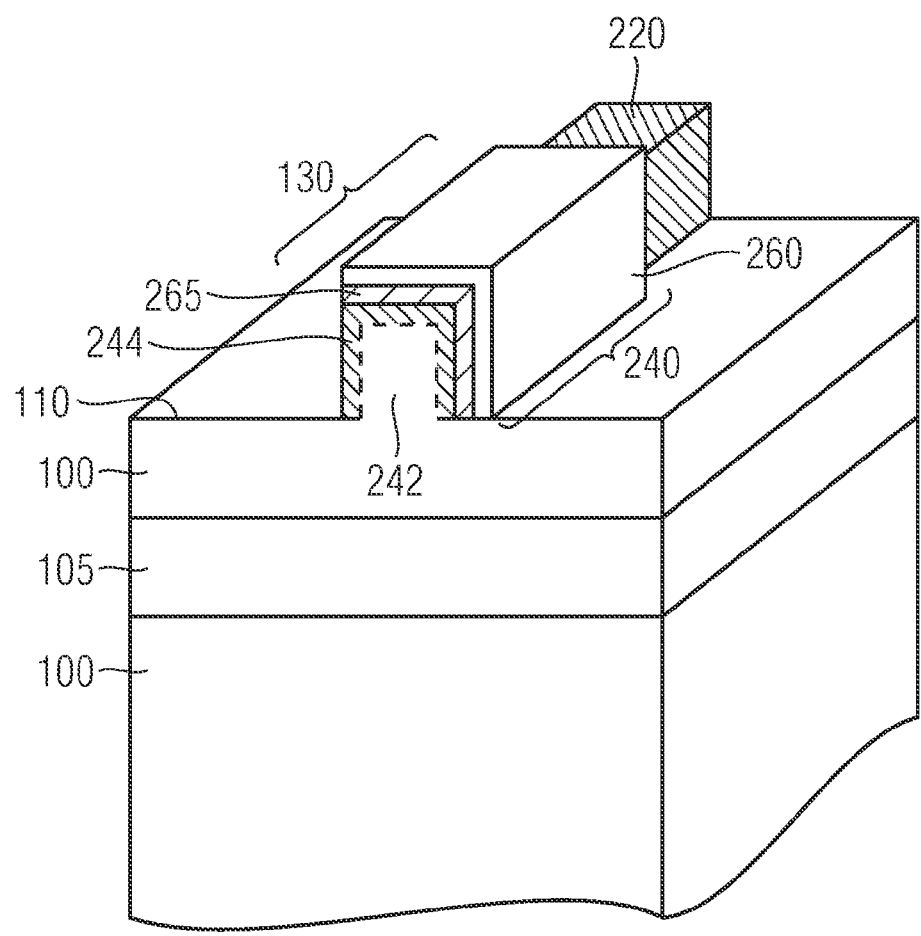
FIG. 2A shows a perspective view of elements of a semiconductor device according to a further embodiment.

FIG. 2A shows a portion of the drain extension region 240 in a case in which in addition to the cover portion 244 a field plate 260 and a field dielectric layer 265 are disposed adjacent to the drain extension region 240. The field plate 260 is insulated from the drain extension region 240 by means of the field dielectric layer 265. The drain extension region 240 comprises a core portion 242 of the first conductivity type and a cover portion 244 of the second conductivity type, in a similar manner as in the embodiment illustrated in FIGS. 1A to 1G. As will be readily appreciated from a comparison of FIGS. 1A and 2A, the gate electrode 250 and the field plate 260 are formed to be adjacent to the same ridge 215 at different positions of the ridge 215.

Figure 2B:
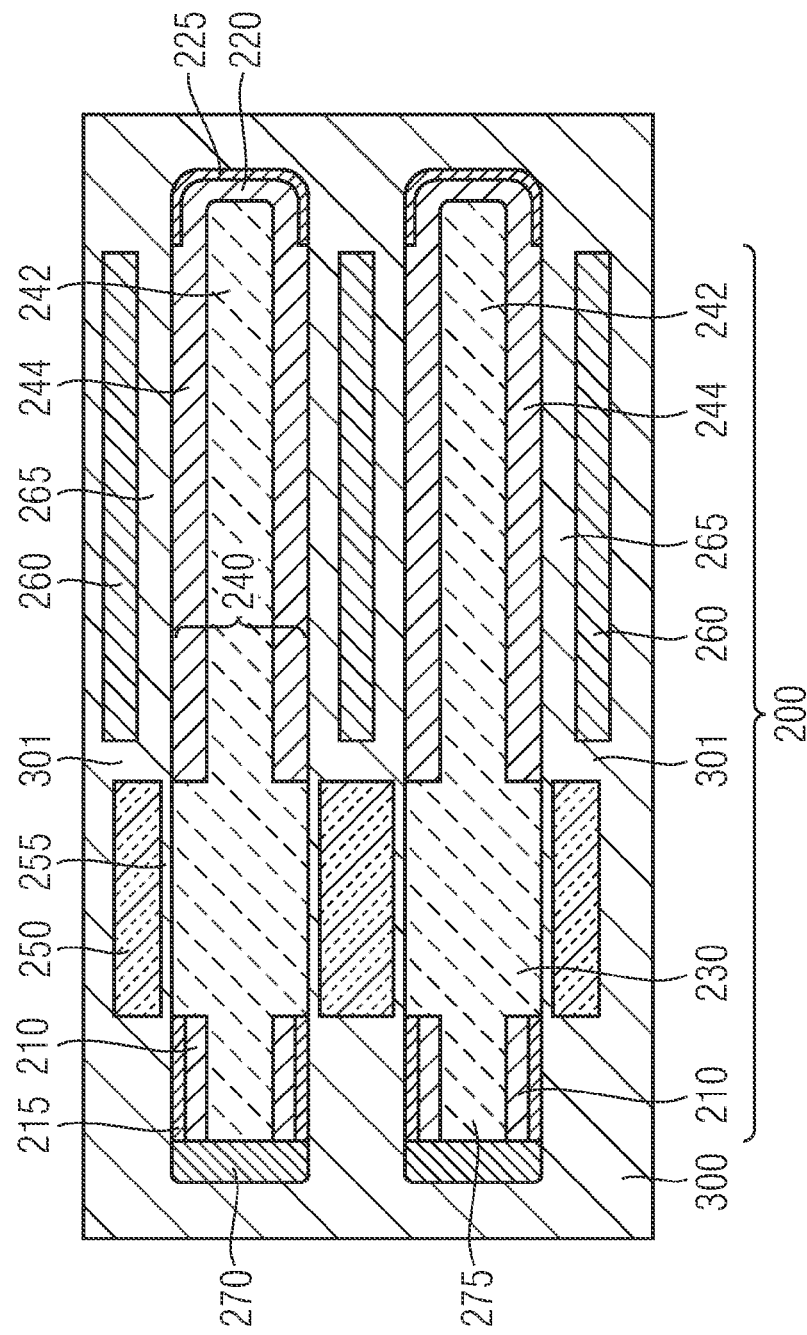
FIG. 2B shows a cross-sectional view of the semiconductor device in a plane parallel to the first main surface of the semiconductor substrate.

FIG. 2B shows a cross-sectional view of the semiconductor device along a plane that is parallel to the first main surface. As is shown, the field plate 260 is disposed so as to be adjacent to the sidewalls of the drain extension region 240. Due to the presence of the field plate 260, the gate-drain capacitance may be further reduced and, additionally, in case of switching-off, the carriers in the drain extension region 240 may be compensated more effectively. As a consequence, the doping concentration of the drain extension region 240 may be increased without deteriorating the breakdown voltage characteristics. For example, the field plate 260 may be connected with the source potential. FIG. 2B further shows an insulating material 301 that is disposed between the field plate 260 and the gate electrode 250. As will be explained below, the lateral thickness of the insulating material 301 may be arbitrarily and precisely set. For example, the lateral thickness of the insulating material 301 may be larger than the thickness of the field oxide layer 265. As a result, it is possible to reduce the gate-field plate capacitance.

FIG. 2C shows a cross-sectional view of the drain extension region 240 in a direction intersecting the first direction. The left-hand portion of FIG. 2C shows a transistor formed in a p- or n-doped substrate including a buried well implantation portion 105, and the transistor shown in the right-hand portion of FIG. 2C is a transistor formed in an SOI substrate including a buried oxide layer 106. The upper portion of FIG. 2C shows the position of the cross-sectional view. As is further shown in FIG. 2C, the field plate 260 fills the spaces between the adjacent second ridge portions 130.

Figure 2D:
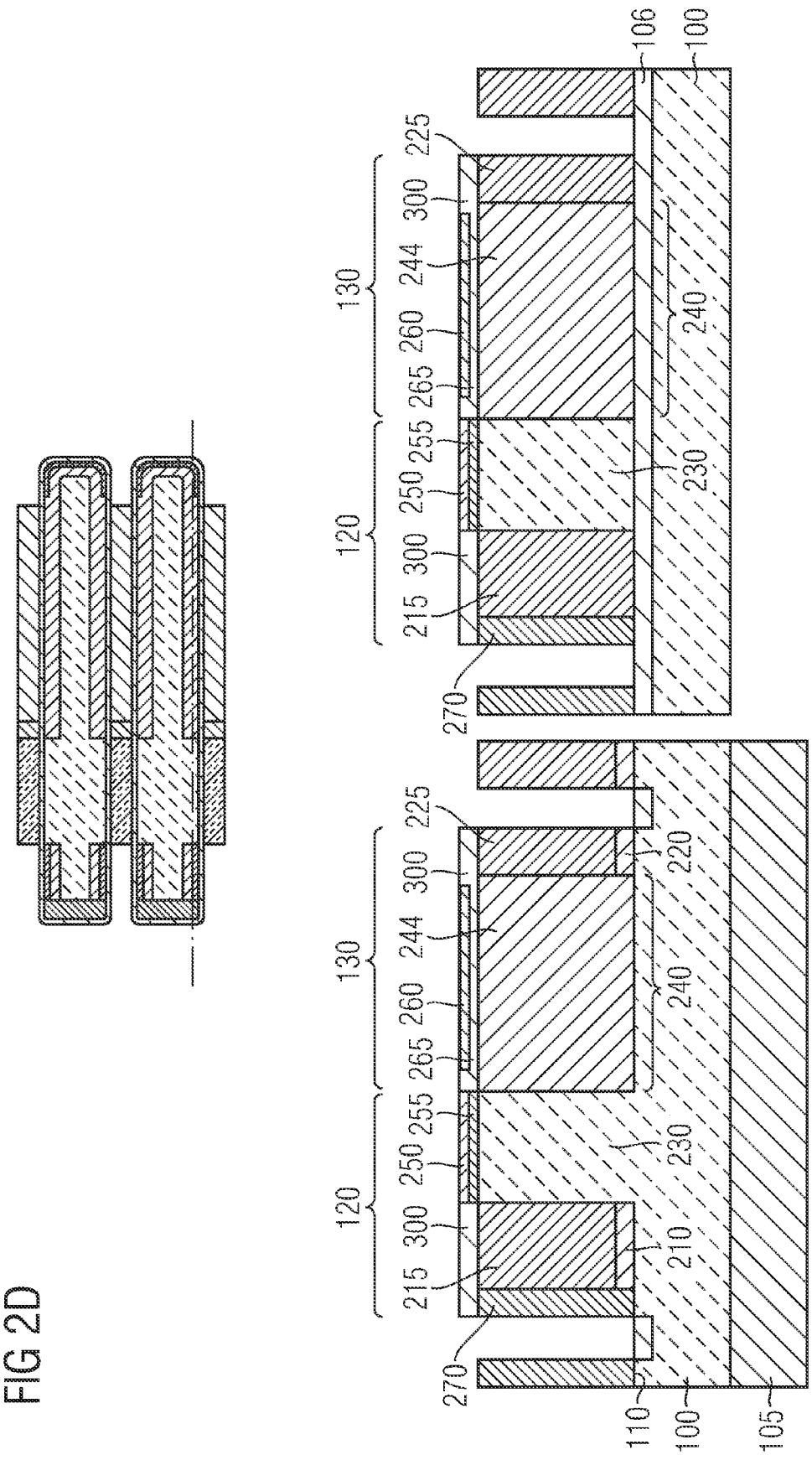

FIG. 2D shows a cross-sectional view similar to the cross-sectional view shown in FIG. 1E. As is shown, the field plate 260 is formed over the top side of the second ridge portion 130, the field plate 260 being insulated from the cover layer 244 by means of the field dielectric layer 265. FIG. 2E shows a cross-sectional view of the transistor parallel to the first direction between adjacent ridges. As is shown, the space between adjacent ridges is filled with a gate electrode 250 and the field plate 260. Since the space between adjacent ridges is filled with the gate electrode 250, the gate-drain capacitance can be further reduced. According to the implementation, in which the field plate 260 fills the space between adjacent ridges, a small resistivity can be achieved and corresponding losses can be avoided.

FIG. 2F shows a cross-sectional view of the transistor taken at a similar position as the cross-sectional view of FIG. 1F. As is shown, the field plate 260 is disposed over the top side of the drain extension region 240, the field plate 260 being insulated from the drain extension region 240 by means of the field dielectric layer 265.

Figure 2G:
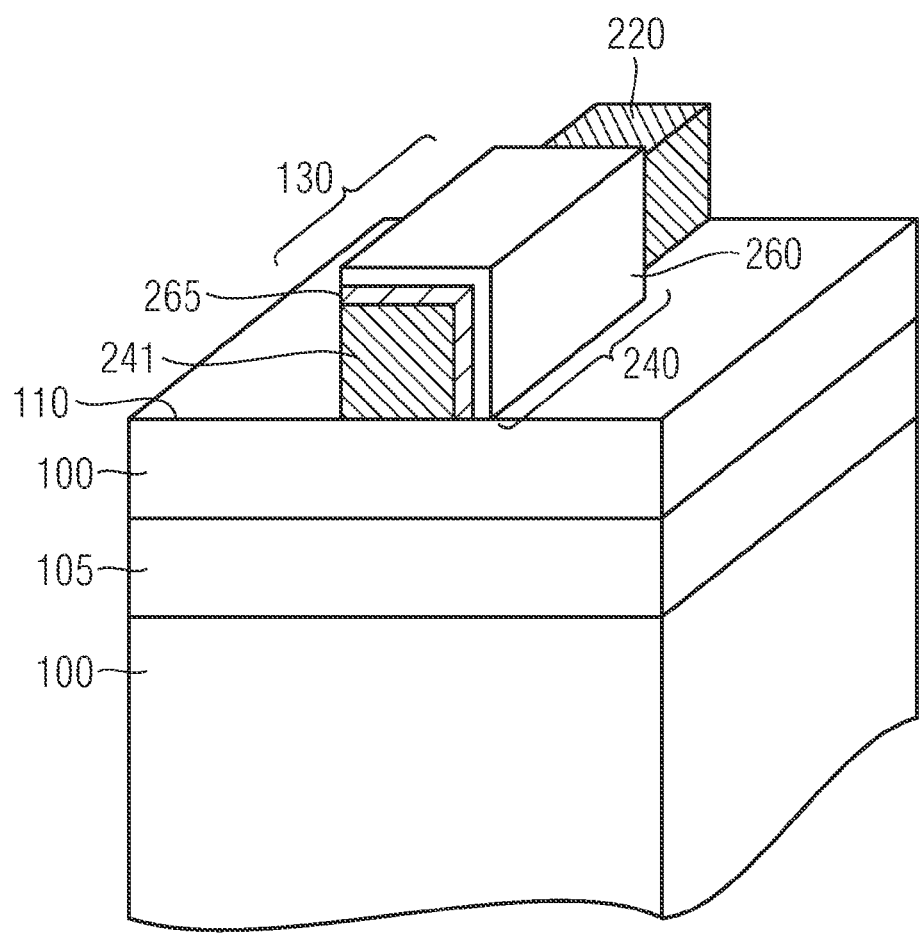
FIG. 2G shows a perspective view of elements of a semiconductor device according to a further embodiment.

According to a further embodiment as is illustrated in FIG. 2G, the semiconductor device of FIGS. 2A to 2F may be implemented in a manner in which the drain extension region 240 does not comprise a core portion 242 and in which the drain extension region is completely doped with the second conductivity type.

As is shown in FIG. 2G, a semiconductor device comprises a transistor 200, formed in a semiconductor substrate 100 comprising a first main surface 110, the transistor comprising a channel region 230, doped with dopants of a first conductivity type, a source region 210, a drain region 220, the source region 210 and the drain region 220 being doped with a second conductivity type, different from the first conductivity type. The transistor further comprises a drain extension region 240, a gate electrode 250 adjacent to the channel region 230, and a field plate 260 being disposed adjacent to the drain extension region 240. The channel region 230 is disposed in a first portion 120 of a ridge 115, and the drain extension region 240 is disposed in a second portion 130 of the ridge 115.

FIG. 2G shows a portion of the drain extension region 240 which may be made of a doped portion 241 of the second conductivity type. A field plate 260 and a field dielectric layer 265 are disposed adjacent to the drain extension region 240. The field plate 260 is insulated from the drain extension region 240 by means of the field dielectric layer 265. As will be readily appreciated from a comparison of FIGS. 1A and 2G, the gate electrode 250 and the field plate 260 are formed to be adjacent to the same ridge 215 at different positions of the ridge 215.

As will be explained below, the field plate 260 may be formed after forming the gate electrode 250. Further, the field plate 260 may be formed in a self-aligned manner with respect to the gate electrode 250.

Figure 3:
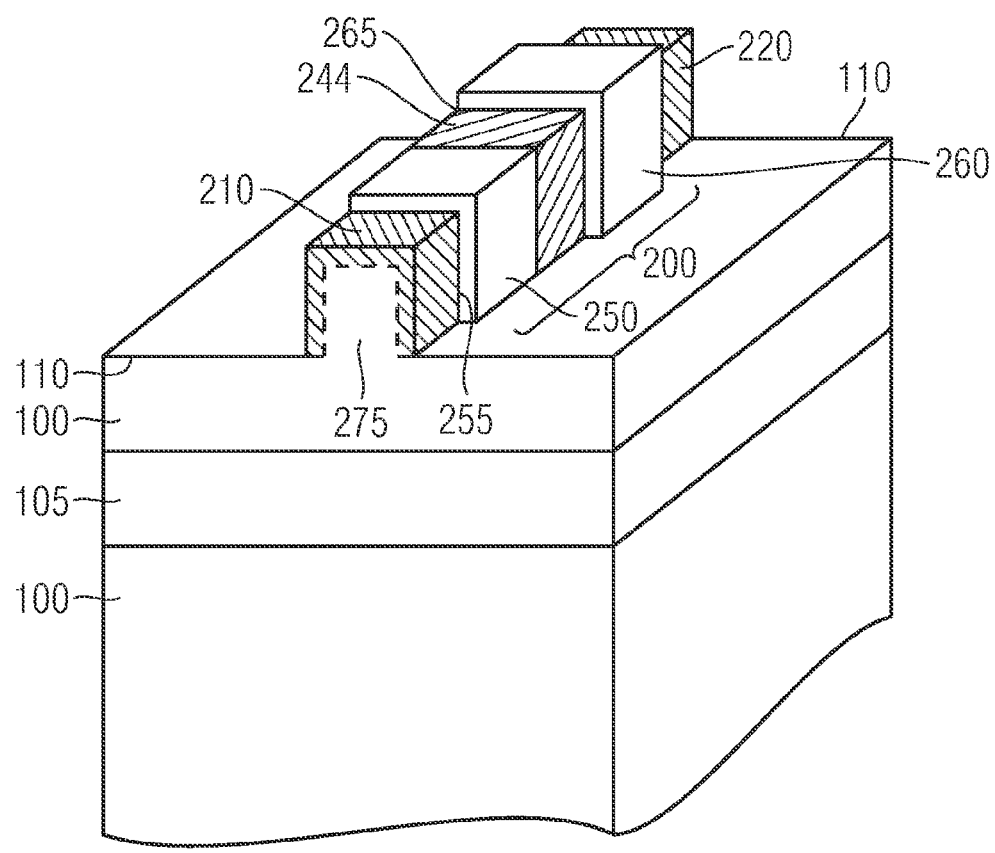
FIG. 3 shows a perspective view of a semiconductor device according to a further embodiment.

FIG. 3 shows a perspective view of a semiconductor device according to a further embodiment. The embodiment of FIG. 3 approximately corresponds to the embodiment illustrated in FIG. 1A. Nevertheless, the cover portion 244 of the drain extension region 240 in the embodiment of FIG. 3 is implemented by an epitaxial layer which is formed over the second ridge portion 130. Moreover, a field plate 260 is formed over the drain extension region 240 and is insulated from the drain extension region 240 by means of a field dielectric layer 265.

FIGS. 4A to 4J illustrate a method of manufacturing a semiconductor device according to an embodiment.

Figure 4A:
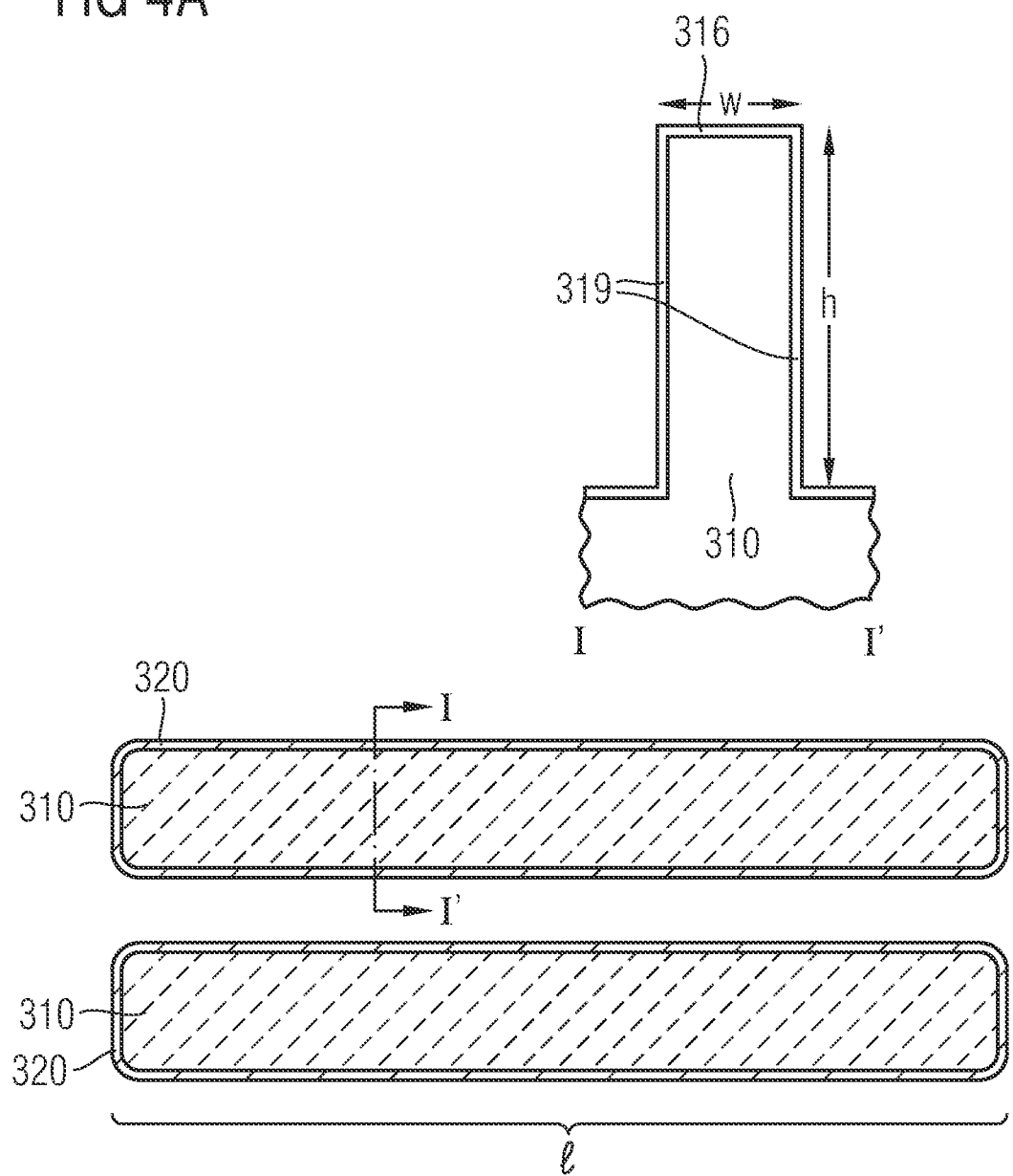
FIGS. 4A to 4J illustrate a method for manufacturing a semiconductor device according to an embodiment.

Starting from a semiconductor substrate, for example, a silicon substrate or an SOI substrate, ridges or fins 310 are etched into the first main surface of the semiconductor substrate. The silicon substrate in which the ridge 310 is formed has the first conductivity type, for example, p type. Etching may be accomplished by plasma etching. For example, the ridges may have a top side 316 and sidewalls 319 extending along a first direction that corresponds to an arrangement direction of the components of the processed transistor. For example, the width w of the ridge may be about 200 to 1000 nm, and a height of the ridge h may be approximately 1 to 10 µm. The ridge 310 may have a length of approximately 1 to 10 µm. For example, a ridge for a voltage of 40 V may have a length of approximately 2 µm. Thereafter, an oxidation step, e.g. using thermal oxidation is performed so as to form a thin silicon oxide layer 320. For example, the silicon oxide layer 320 may have a thickness of approximately 5 to 50 nm. FIG. 4A shows in the lower part thereof a cross-sectional view that is taken parallel to the first main surface of the two ridges 310.

Moreover, the upper portion of FIG. 4A illustrates a cross-sectional view between I and I', and specifically illustrates the dimensions of the ridge 310.

Figure 4B:
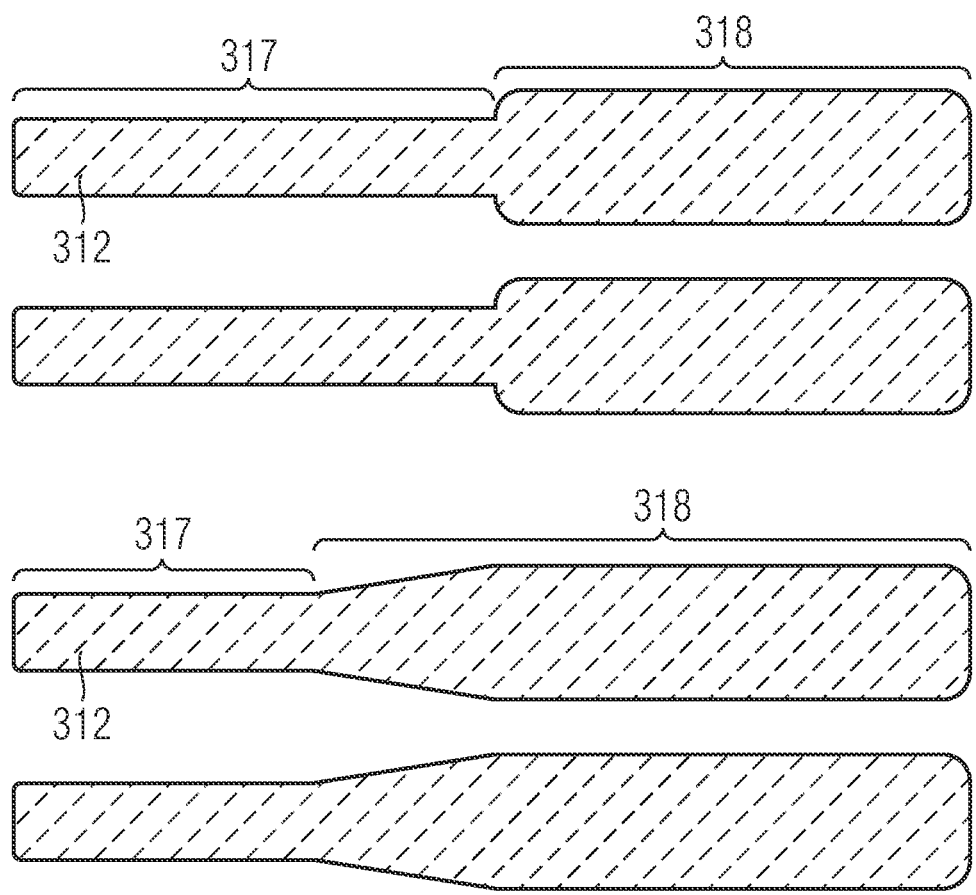

According to the embodiment illustrated in FIG. 4A, the ridge 310 may have an equal shape along the whole length I thereof. According to a further embodiment, the ridge may have a broadened portion. For example, FIG. 4B illustrates a ridge 312 comprising a first ridge portion 317 and a second ridge portion 318. As is shown in FIG. 4B according to an embodiment, the second ridge portion 318 may have a larger width than the first ridge portion 317. Further, as is illustrated in the lower part of FIG. 4B, the second ridge portion 318 may have a sub-portion of an increasing width and a second sub-portion with an increased width with respect to the first ridge portion 317.

In a next step, a conductive layer such as polysilicon may be deposited. For example, the polysilicon layer may have a thickness of 50 to 200 nm. The polysilicon material may be n-doped or may undoped and may be doped after deposition. As further examples, silicide, for example metal silicide, a metal, or a layer stack comprising polysilicon, silicide and/or metal may be employed. The conductive material may have a thickness so that the space between adjacent ridges 310 is completely filled. Alternatively, the conductive layer may have a smaller thickness. Then, the conductive material is patterned so as to form the gate electrode 330.

Figure 4C:
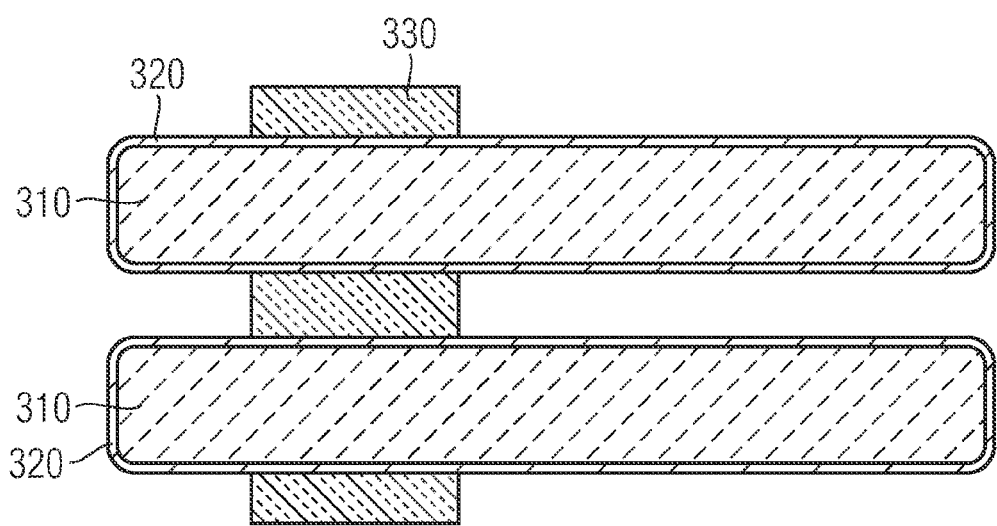

FIG. 4C shows an example of the resulting structure. In particular, when forming the gate electrode and using the ridge structure shown in FIG. 4B, the gate electrode 330 is adjacent to the first ridge portion 317. Thereafter, a doping step with dopants of the second conductivity type is performed using the gate electrode 330 as a mask.

For example, this may be accomplished by a generally known doping method, for example, gas phase doping such as plasma assisted doping (PLAD), pulsed plasma doping, an ion implantation method or a tilted ion implantation method or further doping methods. Optionally, the oxide layer 320 or portions thereof may be removed from the ridge 310 before performing the doping process.

Figure 4D:
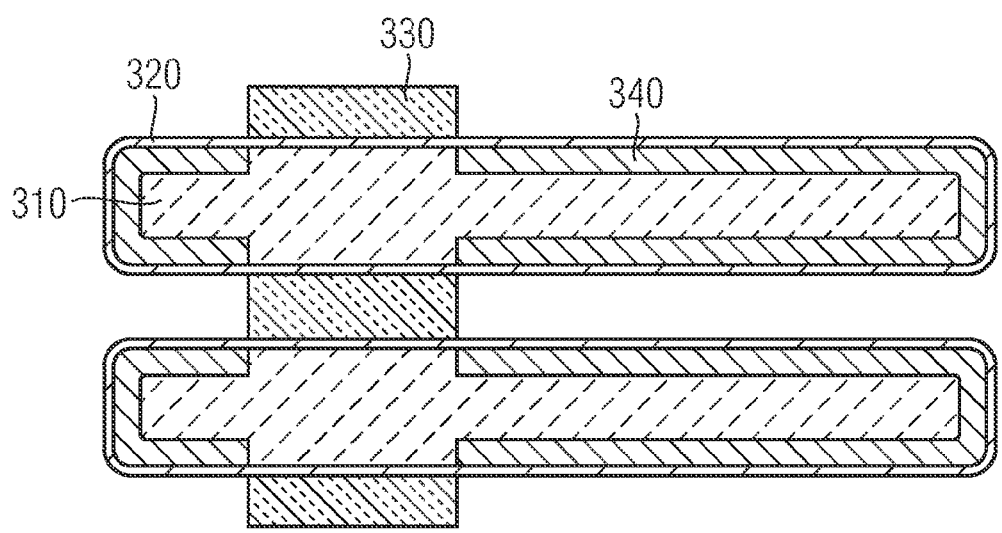

FIG. 4D shows an example of a resulting structure. As is shown, due to the doping process using the gate electrode 330 as an implantation mask, a layer 340 of the second conductivity type is disposed in a self-aligned manner with respect to the gate electrode 330. As a consequence, there is only a small lateral deviation between the starting position of the doped portion of the second conductivity type and the gate electrode 330. In other words, the doped portion 340 of the second conductivity type approximately does not overlap with the gate electrode, nor is there a gap between the gate electrode and the starting point of the doped portion 340 of the second conductivity type. The layer 340 of the second conductivity type may have a thickness of approximately 100 to 500 nm. The thickness of the layer 340 depends from the doping concentration of the layer 340 and from the doping concentration of the ridge. Generally, when the semiconductor device does not comprise a field plate disposed over the ridge, the amount of carriers within layer 340 should be approximately equal to the amount of carriers in the core portion 242 of the ridge. When the semiconductor device comprises a field plate disposed over the ridge, the amount of carriers within layer 340 may be higher than said of the core portion 242, for example may be the double of carriers within the core portion 242.

Thereafter, the portions of the ridge in which the body contact is to be defined, is defined using photolithographical methods. For example, a photomask 350 is formed, so as to leave portions of the ridge 310 uncovered. According to a further embodiment, a selective epitaxy method using in-situ doping may be employed. In this case, a hard mask may be used instead of the patterned photoresist mask.

Figure 4E:
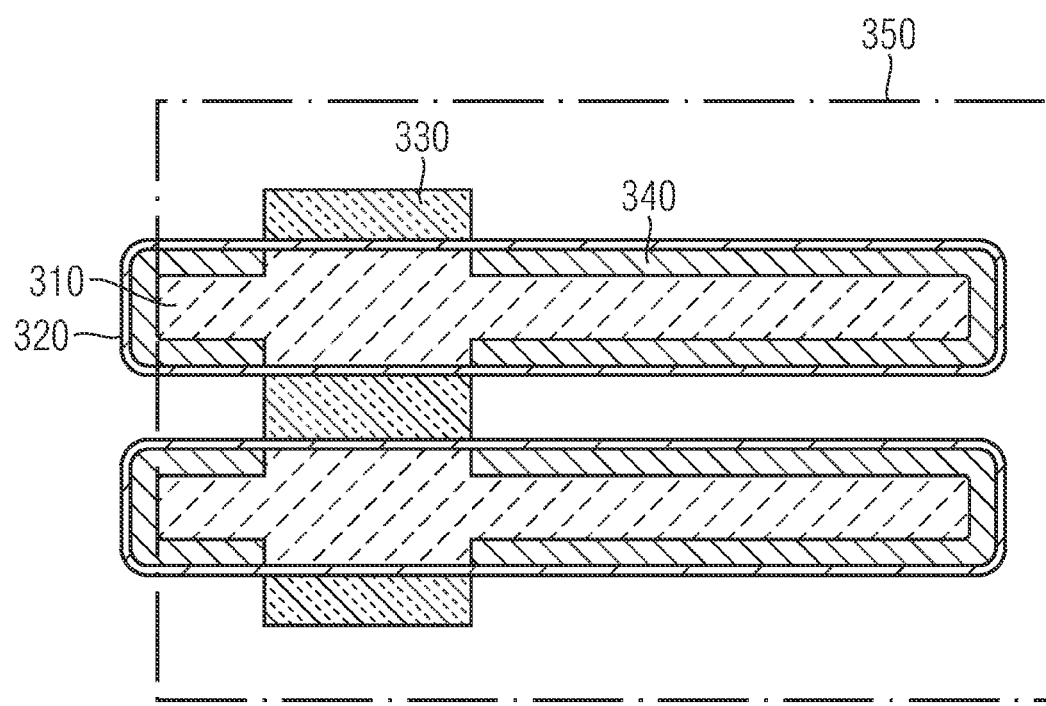

FIG. 4E shows an example of the resulting structure. Thereafter, a further doping process of doping with a first conductivity type is performed so as to provide heavily doped portions of the first conductivity type. For example, a general implantation step or plasma doping or doping from the gas phase may be employed.

Figure 4F:
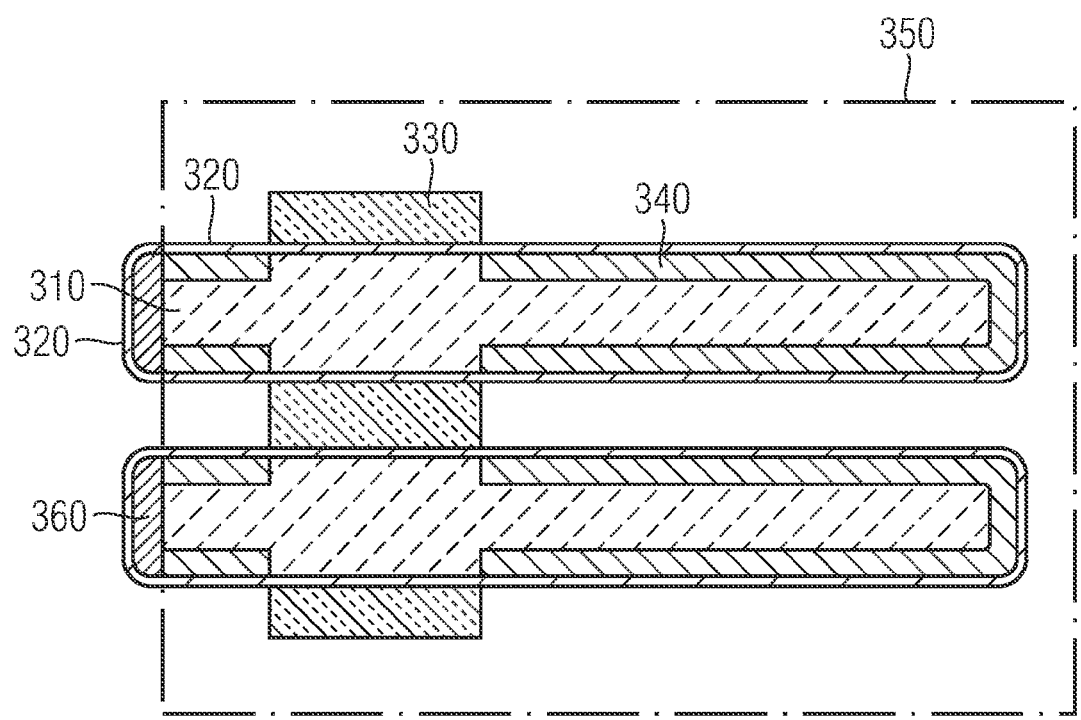

As is shown in FIG. 4F, due to this process, a front end of the ridge 310 may be doped to form the doped portion 360. According to further embodiments, only a side portion adjacent to a source contact may be doped or the body contact path may be implemented in a different manner according to generally known concepts, for example, to implement a buried body contact. According to further embodiment, the semiconductor device may comprise an additional doped well layer that acts as a buried body contact. The doped portion 360 will provide the body contact of the resulting transistor.

Figure 4G:
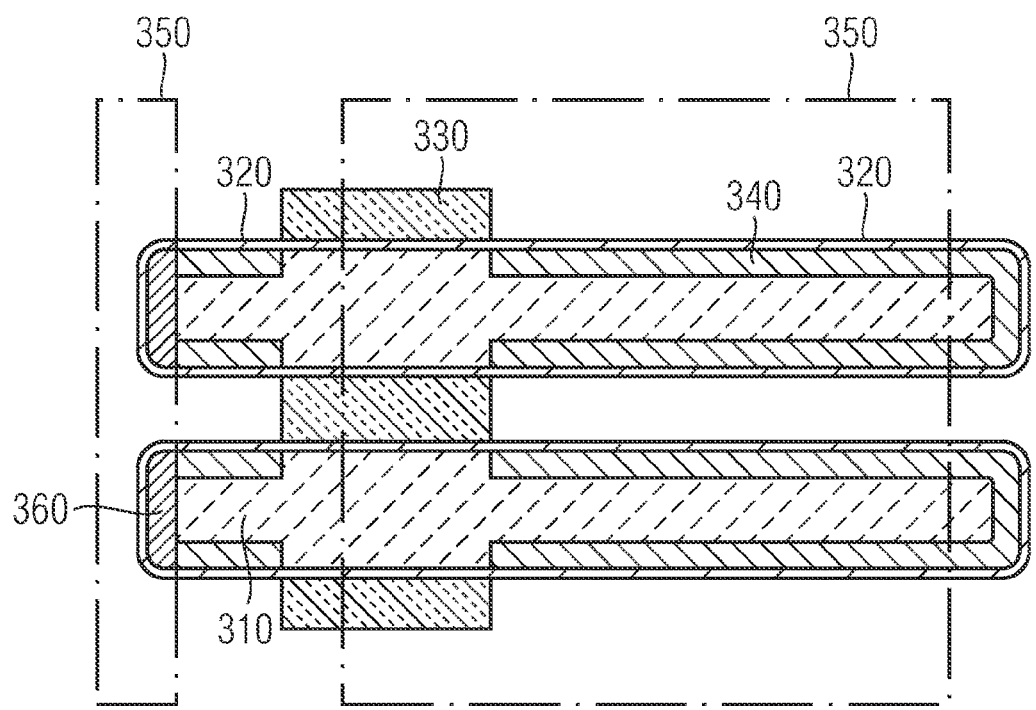

In the next step, a further doping process is performed so as to form heavily doped contacts of the second conductivity type. This may be accomplished by a photolithographic method using a further doping mask 350. As is shown in FIG. 4G, the doping mask 350 is arranged so as to uncover portions of a region between the doped portion 360 and the gate electrode and to further uncover an end portion of each of the ridges 310. Then, a further doping process is performed using, for example, gas phase doping such as plasma doping or ion implantation.

Figure 4H:
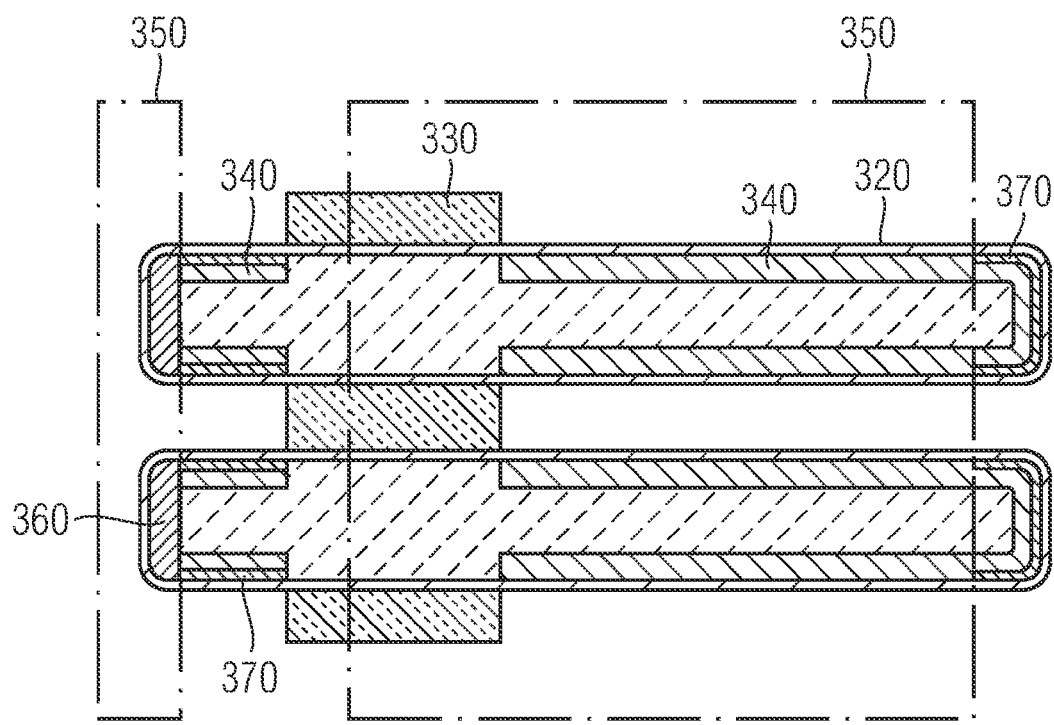

FIG. 4H shows a cross-sectional view of an example of a resulting structure. As is particularly shown, the contact doping for the source region is disposed self-aligned with respect to the gate electrode 330.

Figure 4I:
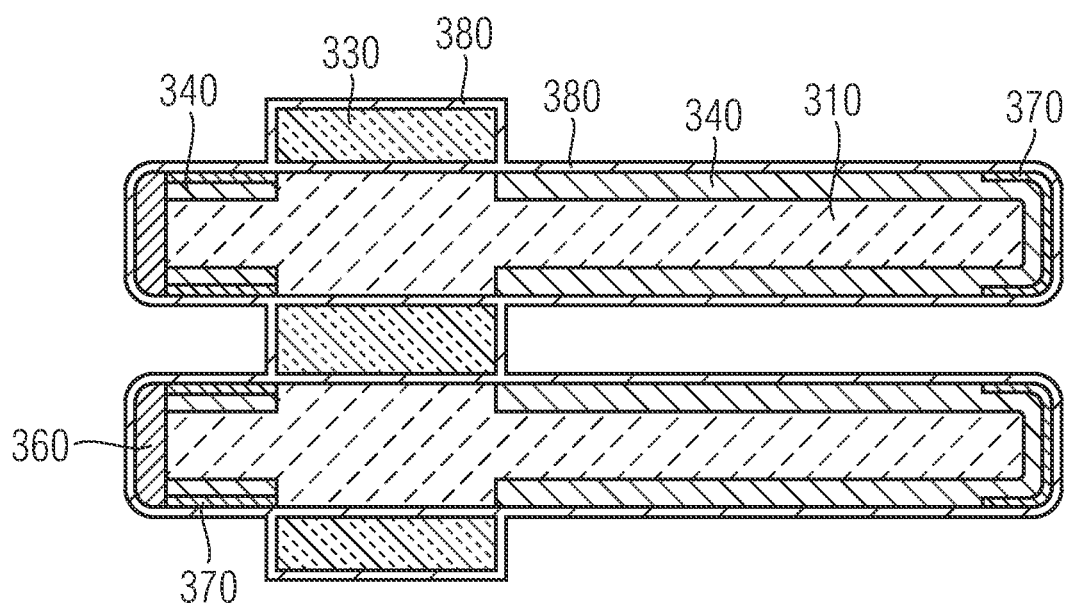

Then, a further insulating layer is formed. For example, the insulating layer may be formed by forming a thin thermal oxide 380. An example of a resulting structure is shown in FIG. 4I. As is shown, the sidewalls of the ridges and the top side thereof are covered by the thin oxide layer 380. This thermal oxidation step may be performed using a comparatively low oxidation temperature (lower than approximately 900° C.). In this case, an oxide is grown adjacent to the gate electrode, so that in the completed transistor comprising a field plate, an oxide layer between the gate electrode and the field plate is thicker than the field oxide layer. Hence, there will be a lower capacitance between the gate electrode and the field plate.

Figure 4J:
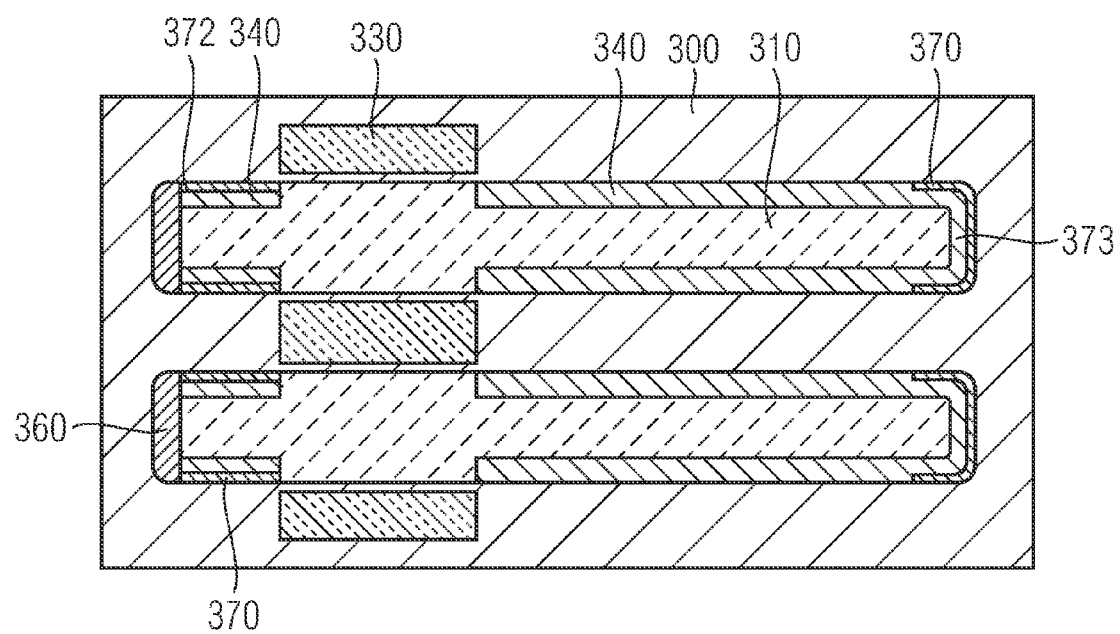

Thereafter, a CVD process using, for example, TEOS (tetraethylorthosilicate) as a starting material may be performed so as to fill the spaces between adjacent ridges 310. FIG. 4J shows an example of a resulting structure. As is shown, the silicon oxide material 300 completely fills the space between adjacent ridges 310.

Thereafter, the semiconductor device may be further processed by providing contacts to the source and drain regions 372, 373, as is conventional. For example, contact trenches for contacting the source and drain region 372, 373 may be etched and filled with a conductive material. According to an embodiment, the contact trenches may be etched so as to extend to approximately a bottom portion of the ridge 310. Nevertheless, it is also possible to contact only the surface portion of the source or drain regions. The conductive material may comprise a metal, for example, tungsten. Further, contacts for contacting the doped portion 360 to provide a bulk contact are formed as is conventional.

According to a further embodiment, starting from the structure shown in FIG. 4J, further, a field plate 260 may be formed so as to be adjacent to the drain extension region 240.

According to this embodiment, starting from the structure shown in FIG. 4J, field plate trenches are etched into the silicon oxide material 300. The position of the trenches is selected so that a field oxide layer having a sufficient thickness is disposed between the resulting field plates and the drain extension regions 240. Further, the lateral position of the trenches may be selected so that insulating material disposed between the field plate and the gate electrode 330 has a sufficient lateral thickness.

Figure 5:
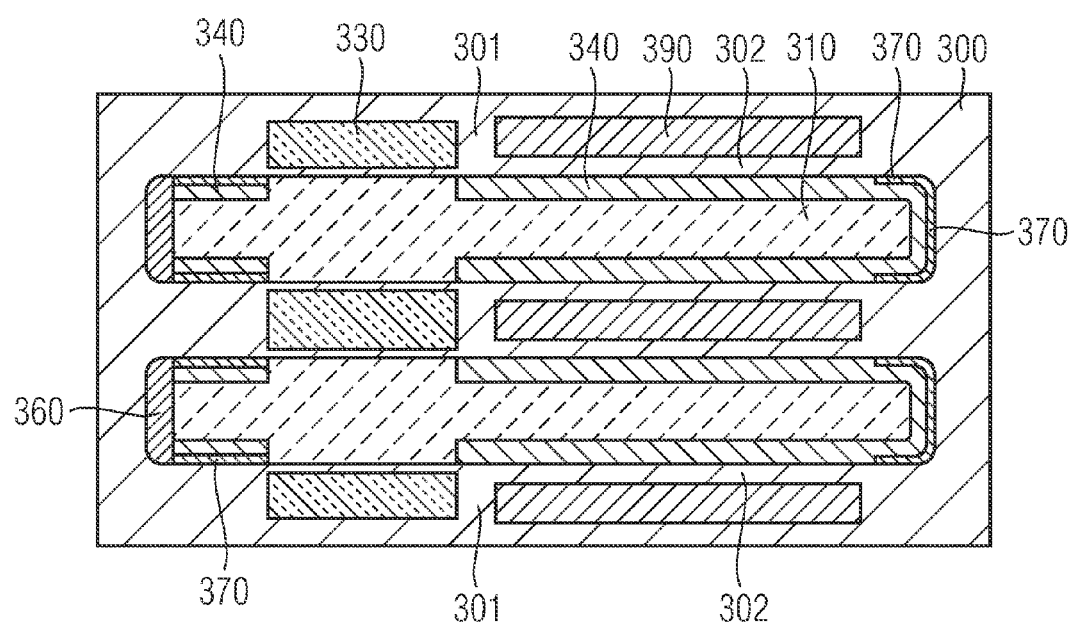
FIG. 5 illustrates a cross-sectional view of a semiconductor device when employing the method of manufacturing a semiconductor device according to a further embodiment.

Thereafter, conductive material for forming the field plate is deposited. For example, the field plate may comprise heavily doped polysilicon, silicide, for example metal silicide and/or metal, or a stack of these materials. The conductive material may be removed from the gate electrode. The field plate may be connected to the source electrode, for example, at a side end portion of a block of transistors connected in parallel to each other. According to an embodiment, the thickness of the conductive material may be selected such that the trenches between adjacent ridges are completely filled so as to reduce a resulting resistance. According to a further embodiment, the field plate may be deposited when forming the source contacts that contact the source portion. According to an embodiment, the conductive layer of the field plate may be removed from the gate electrode or from at least a portion over the gate electrode in order to reduce a gate electrode-field plate capacitance. FIG. 5 shows an example of a resulting structure. In particular, as is shown, field plates 390 are disposed between adjacent ridges and are disposed over the drain extension region 240. Further, the insulating material 301 between the field plate 390 and the gate electrode 330 has a lateral thickness that may be larger than a thickness of the field oxide layer 302. Thereby, a gate—field plate capacitance may be further reduced.

According to a modification, starting from the structure shown in FIG. 4H, a thin silicon oxide layer is formed over the top surface and the sidewalls of the ridge 310 so as to cover the drain extension region and the gate electrode, similar to the embodiment shown in FIG. 4I. The thin silicon oxide layer may be formed by thermal oxidation or by conformal deposition. The thin silicon oxide layer formed over the drain extension region will act as a field oxide layer in the completed device.

Thereafter, a conductive material for forming the field plate is formed in the remaining grooves between adjacent ridges 310. The conductive material may comprise any of the materials for forming the field plate as mentioned above. The conductive material may be formed so as to completely fill the grooves between adjacent ridges 310. Alternatively, the conductive material may be formed as a conformal layer. Then, the conductive material is patterned to form the field plate.

Figure 6:
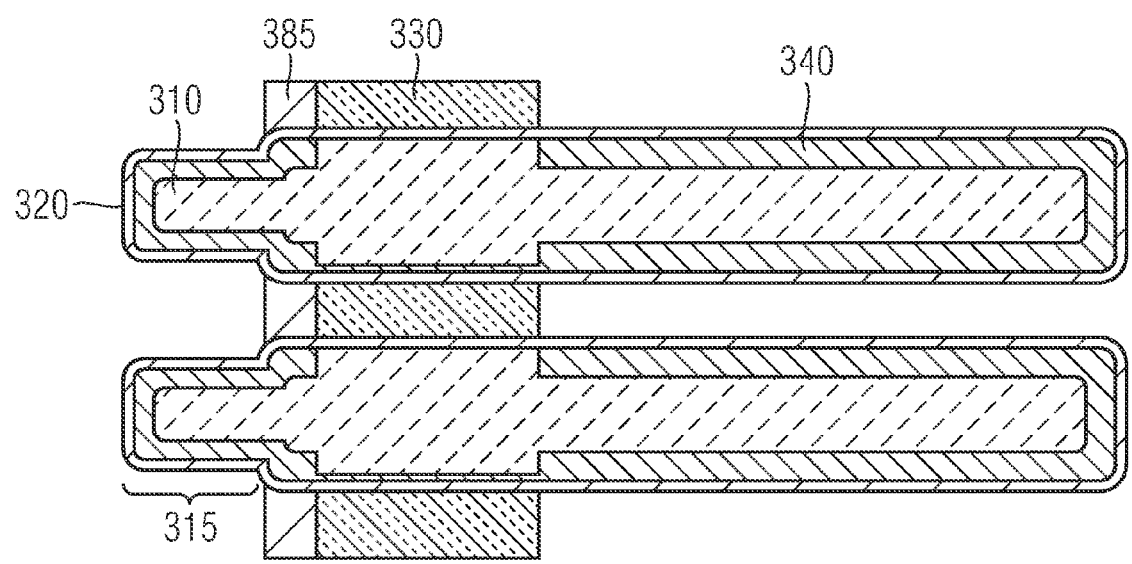
FIG. 6 illustrates a modification of the method illustrated in FIG. 4.

FIG. 6 shows a further modification of the method described above. As is shown, the ridge 310 may be narrowed at a source side or a drain side thereof to form a narrowed ridge portion 315. Further, a spacer 385 of an insulating material may be formed at a sidewall of the gate electrode 330 so as to protect the gate oxide from under-etching. Thereby, the electrical properties of the resulting transistor may be further improved.

FIG. 7 illustrates an embodiment in which the cover portion 340 of the drain extension region is formed by means of selective epitaxy. Starting point for performing this method is a silicon ridge 312 comprising a silicon oxide layer 320, the silicon oxide layer 320 having a thickness of approximately 5 to 50 nm. As is illustrated in FIG. 7A, the ridge 312 may have a broadened portion. Nevertheless, as is clearly to be understood, the ridge 312 also may have a homogenous width. In a first step, the silicon oxide layer 320 is patterned so as to form the gate oxide portion. FIG. 7B shows an example of a resulting structure.

Thereafter, a selective epitaxy method is used, according to which epitaxial material is only formed over the uncovered portions of the silicon ridge 312. During this selective epitaxy method, the silicon material is in-situ doped with a dopant of the second conductivity type so as to form the cover portion 340 of the drain extension region. As is shown in FIG. 7C, the cover portion 340 is formed in a self-aligned manner with respect to the position of the oxide layer 320. The pitch of the ridges and the thickness of the grown layer may be selected so that the epitaxial regions merge and grow together.

Figure 8:
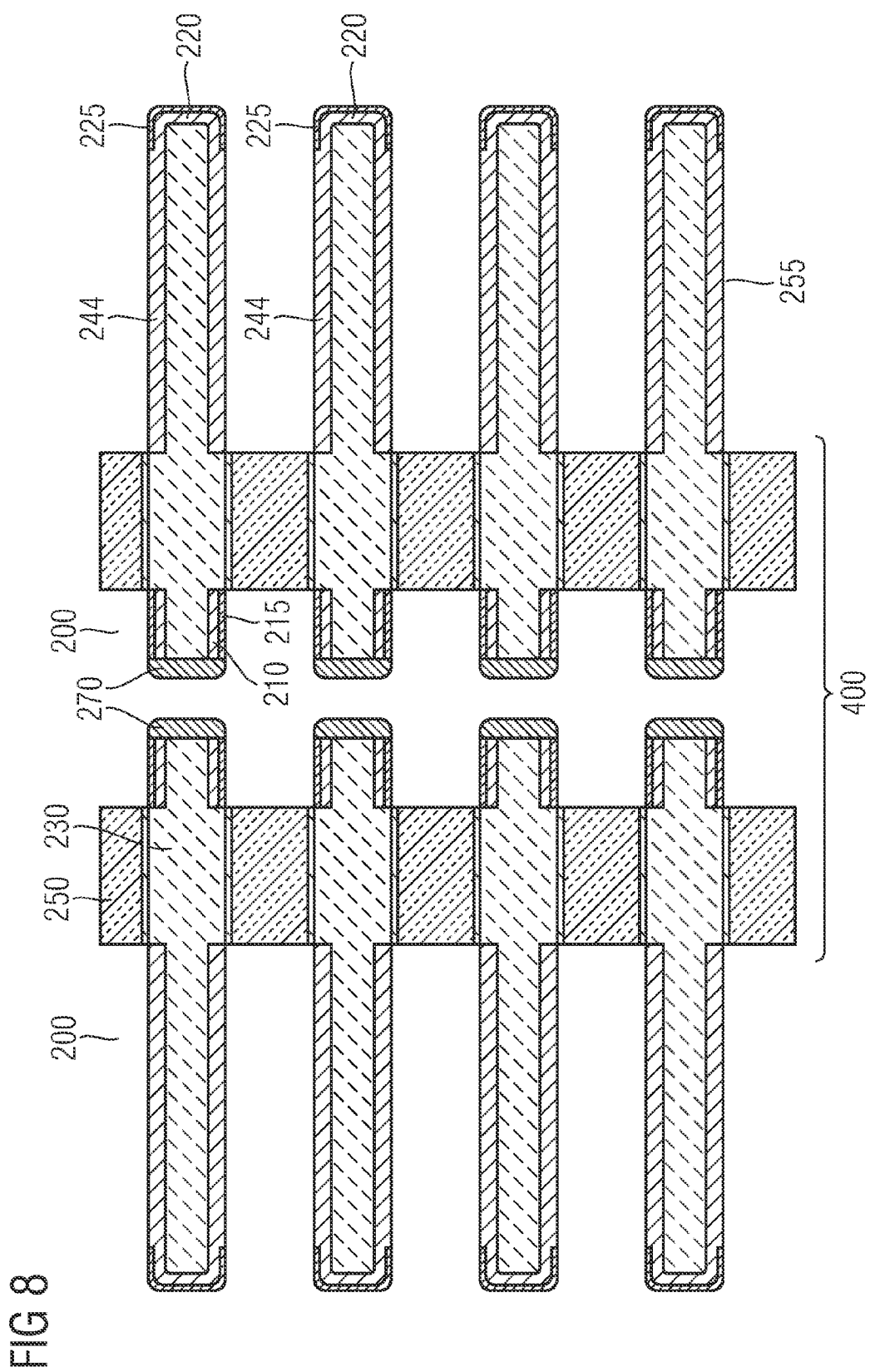
FIG. 8 illustrates a semiconductor device according to a further embodiment.

FIG. 8 shows an example of an array of transistors having the structure as discussed herein above. Although FIG. 8 shows transistors, which do not comprise a field plate, it is to be clearly understood that transistors comprising a field plate may be arranged in a corresponding manner. As is shown, a plurality of transistors of a row are arranged so that the bulk contacts 270 face each other so that a corresponding contact may be easily accomplished. Further, the transistors of respective columns are arranged so that, for example, source metallization and drain metallization may be formed by patterning stripes of a conductive material.

Figure 9:
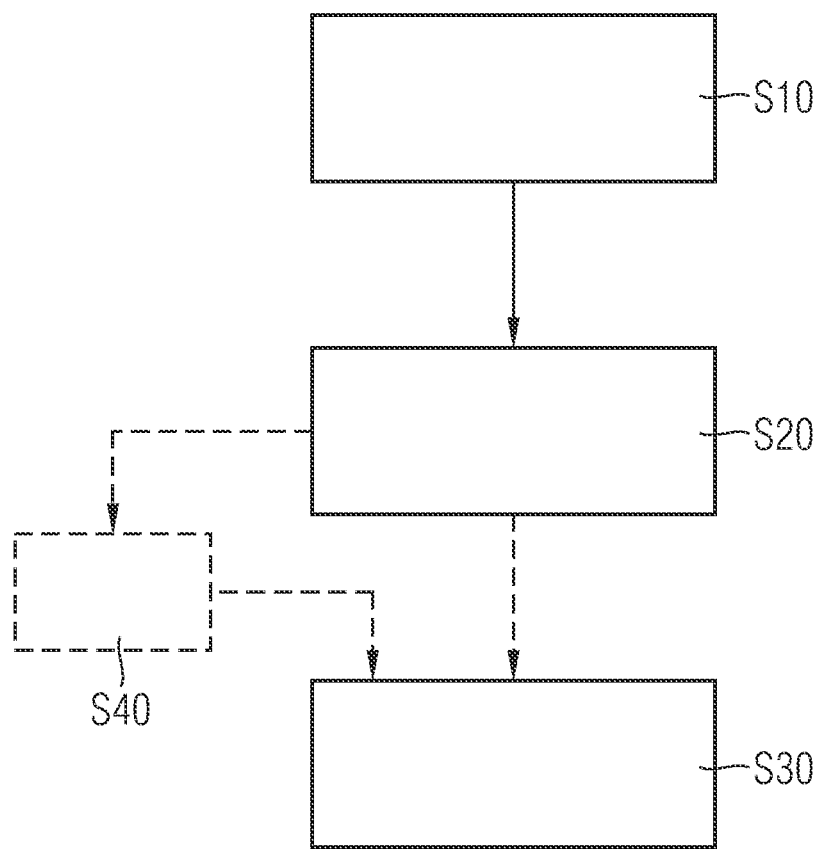
FIG. 9 shows a flowchart illustrating a method of manufacturing a semiconductor device.

FIG. 9 illustrates a method of manufacturing a semiconductor device. The method comprises forming a transistor in a semiconductor substrate, the semiconductor substrate comprising a first main surface, wherein forming the transistor comprises forming a source region, a drain region, a channel region, a drain extension region and a gate electrode adjacent to the channel region, wherein the channel region and the drain extension region are formed so as to be disposed along the first direction between the source region and the drain region, the first direction being parallel to the first main surface, doping the channel region with dopants of a first conductivity type, doping the source and the drain region with dopants of a second conductivity type. As is specifically illustrated in FIG. 9, forming the channel region comprises forming a ridge (S10) including a first ridge portion and a second ridge portion in the semiconductor substrate, the first ridge extending along the first direction, and forming the drain extension region comprises forming a core portion (S20) doped with the first conductivity type in the second ridge portion and forming a cover portion (S30) doped with the second conductivity type, the cover layer being formed so as to be adjacent to a top side and to sidewalls of the second ridge portion.

According to an embodiment, forming the cover portion (S30) may be performed after forming the gate electrode (S40). For example, the cover portion may be formed in a self-aligned manner with respect to the gate electrode. According to an embodiment, the cover portion may be formed by forming a doped portion of the second conductivity type, comprising e.g. any generally known doping methods such as doping from the gas phase, plasma assisted doping (PLAD) or ion implantation including tilted ion implantation. According to a further embodiment, selective epitaxy using in-situ doping may be employed.

The electrical characteristics of FinFETs including different types of field plates and without a field plate were simulated. Each of the FinFETs comprises a channel having a length measured in the first direction of 600 nm and a drain extension region having a length of 500 nm. The effective width of the channel region, i.e. the sum of the lateral extension of the top side, measured perpendicularly with respect to the first direction and the height h was 4.6 µm. The overlap of gate electrode and drain extension region was approximately 10 nm. The pitch between neighboring ridges is 2.4 µm, and the total cell area is 2.52 µm².

Figure 10:
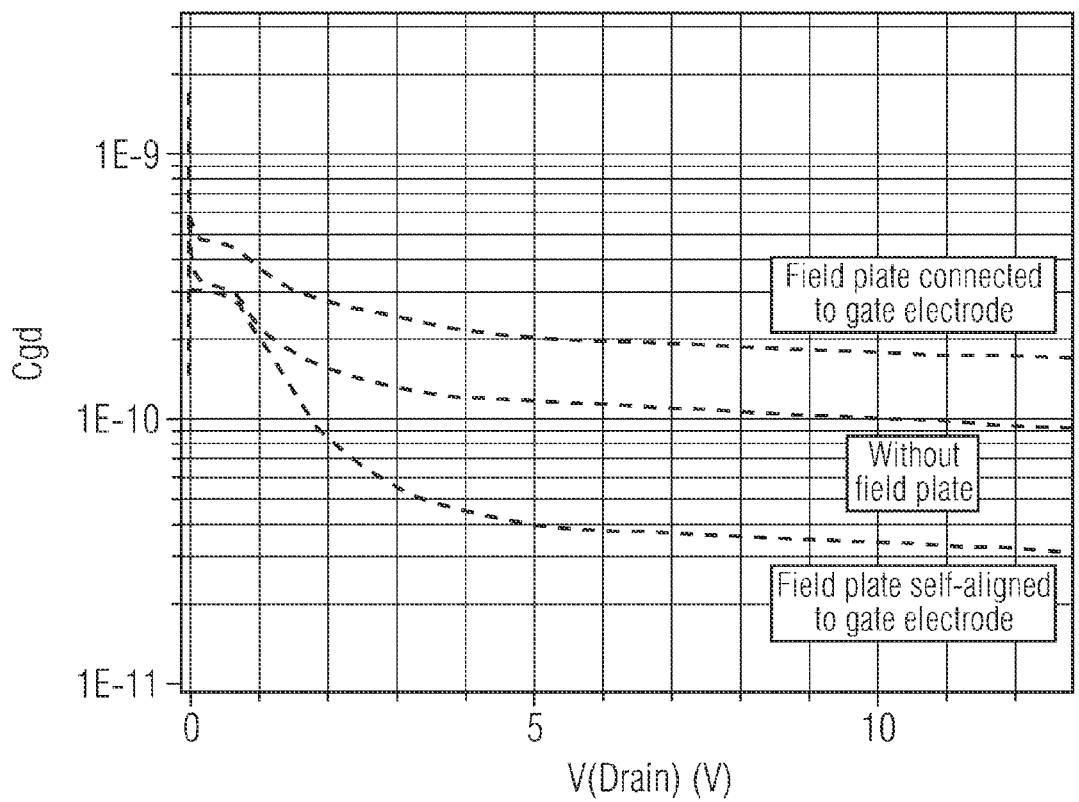
FIG. 10 shows a simulation result of the gate-drain capacitance in dependence from the voltage for different transistors.

FIG. 10 shows the dependence of the gate-drain capacitance from the voltage for several transistors in case the field plate and the gate electrode are connected with each other, in case the field plate has been formed in a self-aligned manner with respect to the gate electrode and is held at a source potential, and without a field plate. As is shown, the transistor comprising a field plate that is held at source potential and which has been manufactured self-aligned with respect to the gate electrode, has a remarkably reduced gate-drain capacitance with respect to the transistor without a field plate or a transistor in which the field plate is connected with the gate electrode.

Although specific embodiments have been illustrated and described herein, it will be appreciated by those of ordinary skill in the art that a variety of alternate and/or equivalent implementations may be substituted for the specific embodiments shown and described without departing from the scope of the present invention. This application is intended to cover any adaptations or variations of the specific embodiments discussed herein. Therefore, it is intended that this invention be limited only by the claims and the equivalents thereof.

What is claimed is:

1. A semiconductor device comprising a transistor, formed in a semiconductor substrate having a first main surface, the transistor comprising:
    a channel region doped with dopants of a first conductivity type;
    a source region doped with dopants of a second conductivity type different from the first conductivity type;
    a drain region doped with dopants of the second conductivity type;
    a drain extension region; and
    a gate electrode adjacent to the channel region,
    the channel region being disposed in a first portion of a ridge, the drain extension region being disposed in a second portion of the ridge, the drain extension region comprising a core portion doped with the first conductivity type, the drain extension region further comprising a cover portion doped with the second conductivity type, the cover portion being adjacent to at least one or two sidewalls of the second portion of the ridge.

2. The semiconductor device according to claim 1, further comprising:
    a field plate disposed adjacent to the drain extension region; and
    a field dielectric disposed between the cover portion of the drain extension region and the field plate.

3. The semiconductor device according to claim 2, wherein portions of the field plate are disposed at least at two sides of the second portion of the ridge.

4. The semiconductor device according to claim 1, wherein the second portion of the ridge has a width different from a width of the first portion of the ridge.

5. The semiconductor device according to claim 2, wherein the gate electrode and the field plate are isolated from each other.

6. The semiconductor device according to claim 1, wherein the cover portion is disposed in a self-aligned manner with respect to the gate electrode.

7. The semiconductor device according to claim 1, wherein the source region is disposed in a third portion of the ridge, adjacent to the channel region.

8. The semiconductor device according to claim 7, wherein the source region is disposed adjacent to a top side and sidewalls of the third portion of the ridge, a core portion of the third portion of the ridge being doped with dopants of the first conductivity type and forming a body contact path.

9. The semiconductor device according to claim 8, further comprising a bulk contact disposed in contact with the body contact path.

10. An integrated circuit comprising the semiconductor device according to claim 1.

11. The semiconductor device according to claim 1, wherein the cover portion is adjacent to a top side and sidewalls of the second portion of the ridge.

12. A semiconductor device, comprising a transistor formed in a ridge formed in a first main surface of a semiconductor substrate, the transistor comprising:
   a channel region of a first conductivity type in at least a part of the ridge;
   a drain extension region disposed in another part of the ridge, the drain extension region comprising a core portion of the first conductivity type and a cover portion of a second conductivity type, the cover portion being disposed at least at one or two sidewalls of the ridge;
   a source region and a drain region of the second conductivity type; and
   a gate structure disposed to opposing sidewalls of the ridge, the channel region and the drain extension region being disposed along a first direction between the source region and the drain region, the first direction being parallel to the first main surface.

13. The semiconductor device according to claim 12, further comprising:
   a field plate and a field dielectric layer, the field plate being adjacent to the drain extension region, the field dielectric layer being disposed between the cover portion and the field plate.

14. The semiconductor device according to claim 12, wherein the source region is disposed at a top side and two sidewalls of the ridge, a core portion of the ridge at a position of the source region being doped with dopants of the first conductivity type.

15. The semiconductor device according to claim 12, wherein the cover portion is adjacent to a top side and sidewalls of the ridge.

16. A semiconductor device comprising a transistor, formed in a semiconductor substrate having a first main surface, the transistor comprising:
   a channel region doped with dopants of a first conductivity type;
   a source region doped with dopants of a second conductivity type different from the first conductivity type;
   a drain region doped with dopants of the second conductivity type; and
   a gate electrode adjacent to the channel region,
   the channel region being disposed in a first portion of a ridge, the source region being disposed in a further portion of the ridge, adjacent to the channel region, wherein the source region is disposed adjacent to at least one of a top side and two sidewalls of the further portion of the ridge, a core portion of the further portion of the ridge being doped with dopants of the first conductivity type and forming a body contact path.

17. The semiconductor device according to claim 16, further comprising a drain extension region disposed between the channel region and the drain region.

18. A semiconductor device comprising a transistor, formed in a semiconductor substrate having a first main surface, the transistor comprising:
   a channel region doped with dopants of a first conductivity type;
   a source region doped with dopants of a second conductivity type;
   a drain region doped with dopants of the second conductivity type;
   a drain extension region;
   a gate electrode adjacent to the channel region; and
   a field plate disposed adjacent to the drain extension region,
   the channel region being disposed in a first portion of a ridge, the drain extension region being disposed in a second portion of the ridge, the field plate being disposed adjacent to at least two sidewalls of the ridge.

19. The semiconductor device according to claim 18, further comprising an insulating material disposed between the gate electrode and the field plate and a field dielectric layer between the field plate and the drain extension region, a thickness of the insulating material measured parallel to the first main surface being larger than a thickness of the field dielectric layer measured perpendicularly to the first main surface.

* * * * *